US 6,750,508 B2

(12) United States Patent
Omura et al.

(10) Patent No.: US 6,750,508 B2
(45) Date of Patent: Jun. 15, 2004

(54) POWER SEMICONDUCTOR SWITCHING ELEMENT PROVIDED WITH BURIED ELECTRODE

(75) Inventors: Ichiro Omura, Yokohama (JP); Wataru Saito, Kawasaki (JP); Tsuneo Ogura, Kamakura (JP); Hiromichi Ohashi, Yokohama (JP); Yoshihiko Saito, Yokosuka (JP); Kenichi Tokano, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/892,545

(22) Filed: Jun. 28, 2001

(65) Prior Publication Data
US 2002/0030237 A1 Mar. 14, 2002

(30) Foreign Application Priority Data

Jun. 30, 2000 (JP) ........................................ 2000-200130
May 15, 2001 (JP) ........................................ 2001-144730

(51) Int. Cl.$^7$ .......................... H01L 29/76; H01L 29/94; H01L 31/062; H01L 31/113
(52) U.S. Cl. ..................... 257/329; 257/330; 257/331; 257/341
(58) Field of Search .................. 257/329, 330, 257/331, 341, 397, 332

(56) References Cited

U.S. PATENT DOCUMENTS

| 4,754,310 | A | 6/1988 | Coe .............................. 257/330 |
| 4,941,026 | A | 6/1990 | Temple | |
| 5,637,898 | A | 6/1997 | Baliga .......................... 257/330 |
| 5,801,417 | A | * 9/1998 | Tsang et al. ................. 257/331 |
| 5,998,833 | A | * 12/1999 | Baliga .......................... 257/329 |
| 5,998,883 | A | 12/1999 | Baliga | |

FOREIGN PATENT DOCUMENTS

| DE | 196 04 043 | 8/1997 | |
| DE | 198 48 828 | 5/2000 | |
| DE | 100 07 415 | 9/2001 | |
| JP | 3-109775 | * 5/1991 | ................. 257/332 |
| JP | 2000-349288 | 12/2000 | |
| WO | WO 94 03922 | 2/1994 | |
| WO | WO 97 35346 | 9/1997 | |
| WO | WO 00 33385 | 6/2000 | |

OTHER PUBLICATIONS

Merchant, S., "Dependence of Breakdown Voltage on Drift Length and Buried Oxide Thickness of SOI RESURF LDMOS Transistors," *Institute of Electrical and Electronics Engineers*, 1993, pp. 124–128.

* cited by examiner

*Primary Examiner*—Steven Loke
(74) *Attorney, Agent, or Firm*—Oblon, Spivak, McClelland, Maier & Neustadt, P.C.

(57) ABSTRACT

A semiconductor element of this invention includes a drift layer of a first conductivity type formed on a semiconductor substrate of the first conductivity type, a well layer of a second conductivity type selectively formed in the surface of the drift layer, a source layer of the first conductivity type selectively formed in the surface of the well layer, a trench formed to reach at least the inside of the drift layer from the surface of the source layer through the well layer, a buried electrode formed in the trench through a first insulating film, and a control electrode formed on the drift layer, the well layer, and the source layer through a second insulating film.

11 Claims, 23 Drawing Sheets

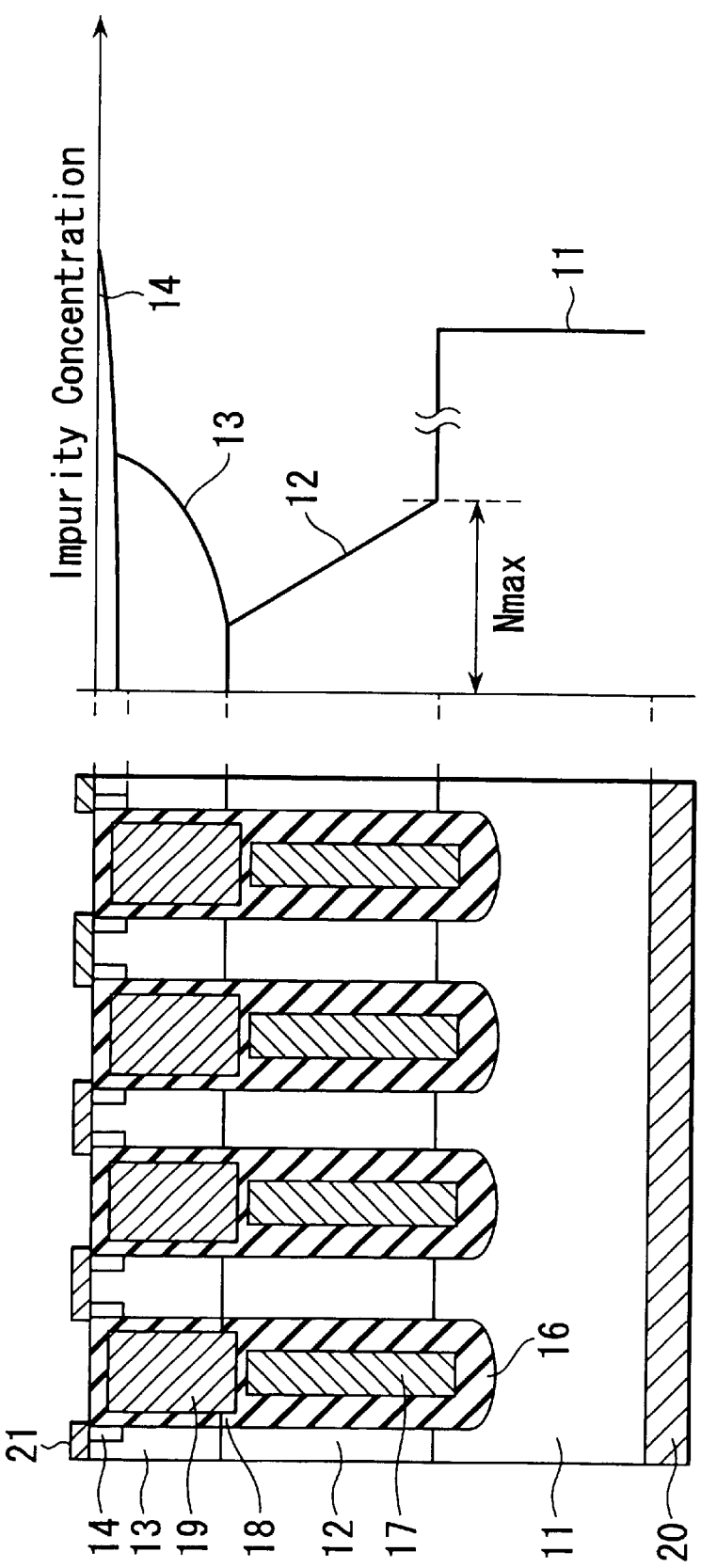

POWER SEMICONDUCTOR SWITCHING ELEMENT PROVIDED WITH BURIED ELECTRODE

CROSS-REFERENCE TO RELATED APPLICATIONS

This application is based upon and claims the benefit of priority from the prior Japanese Patent Applications No. 2000-200130, filed Jun. 30, 2000; and No. 2001-144730, filed May 15, 2001, the entire contents of both of which are incorporated herein by reference.

BACKGROUND OF THE INVENTION

The present invention relates to a power semiconductor switching element and, more particularly, to a semiconductor element having a low ON resistance.

Recently, power MOSFETs (power MOSFETs) have been widely used for power supplies in vehicles, power supplies for computer equipment, motor control power supplies, and the like. For these power supplies, importance is placed on efficiency and downsizing.

In switching power supplies that have been widely used, since power MOSFETs also serve as conventional diodes (synchronous rectification), the characteristics of power MOSFETs are very important. Two characteristics, ON resistance and switching speed, are especially important. As the ON resistance decreases, the energy consumed by a power MOSFET while a current flows decreases, and hence the efficiency of the power supply increases. As the switching speed increases, the switching frequency can be increased. This makes it possible to reduce the size of a magnetic circuit, e.g., a transformer. Therefore, the power supply can be reduced in size, and the efficiency of the magnetic circuit can be increased.

FIG. 44 is a sectional view of a conventional vertical power MOSFET.

As shown in FIG. 44, an n-type drift layer 112 is formed on one surface of an n-type semiconductor substrate 111 by epitaxial growth. P-type well layers 113 for MOS formation are selectively formed in the surface of the drift layer 112. N-type source layers 114 are selectively formed in the surfaces of the well layers 113. Trenches 115 are formed to reach the inside of the drift layer 112 from the surface of the source layers 114 through the well layers 113. Gate electrodes 119 are formed in the trenches 115 through silicon oxide films 118. In addition, a drain electrode 120 is formed on the other surface of the semiconductor substrate 111. Source electrodes 121 connected to the source layers 114 and well layers 113 are formed on the well layers 113.

Even in a case of ideal design, the characteristics of this type of power MOSFET are set in such a manner that the breakdown voltage and ON resistance must always satisfy the relationship defined by inequality (1). It has therefore been thought that any characteristics better than those defined by this relationship cannot be obtained.

$$R_{on} < 2.2 \times 10^{-5} V b^{2.25} \quad (1)$$

where Vb is the static breakdown voltage, and $R_{on}$ is the ON resistance.

However, it has recently been reported that the upper characteristic limit can be exceeded by burying a p-type diffusion layer in the drift layer 112. According to a structure having this buried diffusion layer, the ON resistance certainly decreases. However, since the junction distance (area) is long (large), the junction capacitance is large, resulting in slow switching. For the same reason, too many carriers are injected into a reverse-conducting diode incorporated in an element, and hence the element tends to break during a period of reverse recovery.

In practice, therefore, the range of application of elements having such structures is limited. In addition, in forming an element, many epitaxial layers are formed by repeating epitaxial growth and ion implantation, resulting in an increase in cost.

As described above, in a conventional power MOSFET, it is difficult to decrease the ON resistance. Even if the ON resistance can be decreased, the switching speed decreases and the characteristics of a reverse-conducting diode deteriorate. Furthermore, a problem arises in terms of cost.

BRIEF SUMMARY OF THE INVENTION

According to the first aspect of the present invention, there is provided a semiconductor element comprising a semiconductor substrate of a first conductivity type having a first major surface and a second major surface opposing the first major surface, a drift layer of the first conductivity type formed on the first major surface of the semiconductor substrate, a well layer of a second conductivity type selectively formed in a surface of the drift layer, a source layer of the first conductivity type selectively formed in a surface of the well layer, a trench formed to reach at least an inside of the drift layer from the surface of the source layer through the well layer, a buried electrode formed in the trench through a first insulating film, a control electrode formed on the drift layer, the well layer, and the source layer through a second insulating film, a first main electrode formed on the second major surface of the semiconductor substrate, and a second main electrode connected to the source layer and the well layer.

According to the second aspect of the present invention, there is provided a semiconductor element comprising a semiconductor substrate of a first conductivity type having a first major surface and a second major surface opposing the first major surface, a drift layer of the first conductivity type formed on the first major surface of the semiconductor substrate, a well layer of a second conductivity type selectively formed in a surface of the drift layer, a source layer of the first conductivity type selectively formed in a surface of the well layer, a trench formed to reach at least an inside of the drift layer from the surface of the source layer through the well layer, a buried electrode formed through a first insulating film in a region extending from the trench of the drift layer to a bottom surface of the trench, a control electrode formed in a region extending from the source layer to the drift layer through the well layer in the trench to be insulated from the buried electrode through a second insulating film, a first main electrode formed on the second major surface of the semiconductor substrate, and a second main electrode connected to the source layer and the well layer.

According to the third aspect of the present invention, there is provided a semiconductor element comprising a semiconductor substrate of a first conductivity type having a first major surface and a second major surface opposing the first major surface, a drift layer of the first conductivity type formed on the first major surface of the semiconductor substrate, a trench formed to reach at least an inside of the drift layer from a surface of the drift layer, a buried electrode formed in the trench through a first insulating film, a well layer of a second conductivity type selectively formed in a surface of the drift layer between the trenches, a source layer of the first conductivity type selectively formed in a surface of the well layer, a control electrode formed on the drift layer, the well layer, and the source layer through a second insulating film, a first main electrode formed on the second major surface of the semiconductor substrate, and a second main electrode connected to the source layer and the well layer.

According to the fourth aspect of the present invention, there is provided a semiconductor element comprising a semiconductor substrate of a first conductivity type having a first major surface and a second major surface opposing the first major surface, a drift layer of the first conductivity type formed on the first major surface of the semiconductor substrate, a well layer of a second conductivity type selectively formed in a surface of the drift layer, a first trench formed to reach at least an inside of the drift layer through the well layer, a buried electrode formed in the first trench through a first insulating film, a source layer of the first conductivity type selectively formed in a surface of the well layer between the first trenches, a second trench formed to reach an inside of the drift layer from a surface of the source layer through the well layer, a control electrode formed in the second trench through a second insulating film, a first main electrode formed on the second major surface of the semiconductor substrate, and a second main electrode connected to the source layer and the well layer.

According to the fifth aspect of the present invention, there is provided a semiconductor element comprising a semiconductor substrate of a first conductivity type having a first major surface and a second major surface opposing the first major surface, a drift layer of the first conductivity type formed on the first major surface of the semiconductor substrate, a well layer of a second conductivity type selectively formed in a surface of the drift layer, a buried diffusion layer of the second conductivity type formed to reach at least an inside of the drift layer through the well layer, a source layer of the first conductivity type selectively formed in a surface of the well layer between the buried diffusion layers, a trench formed to reach an inside of the drift layer from a surface of the source layer through the well layer, a control electrode formed in the trench through an insulating film, a first main electrode formed on the second major surface of the semiconductor substrate, and a second main electrode connected to the source layer and the well layer.

According to the sixth aspect of the present invention, there is provided a semiconductor element comprising a semiconductor substrate of a first conductivity type having a first major surface and a second major surface opposing the first major surface, a drift layer of the first conductivity type formed on the first major surface of the semiconductor substrate, a buried diffusion layer of a second conductivity type formed to reach a portion near the semiconductor substrate from a surface of the drift layer, a well layer of the second conductivity type formed in the surface of the drift layer, a source layer of the first conductivity type selectively formed in a surface of the well layer between the buried diffusion layers, a trench formed to reach an inside of the drift layer from a surface of the source layer through the well layer and become shallower than the buried diffusion layer, a control electrode formed in the trench through an insulating film, a first main electrode formed on the second major surface of the semiconductor substrate, and a second main electrode connected to the source layer and the well layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

FIG. 15A is a sectional view showing a semiconductor element according to the first embodiment of the present invention;

FIG. 15B is a view showing the first impurity concentration distribution of the drift layer in the first embodiment;

DETAILED DESCRIPTION OF THE INVENTION

Figure 1:
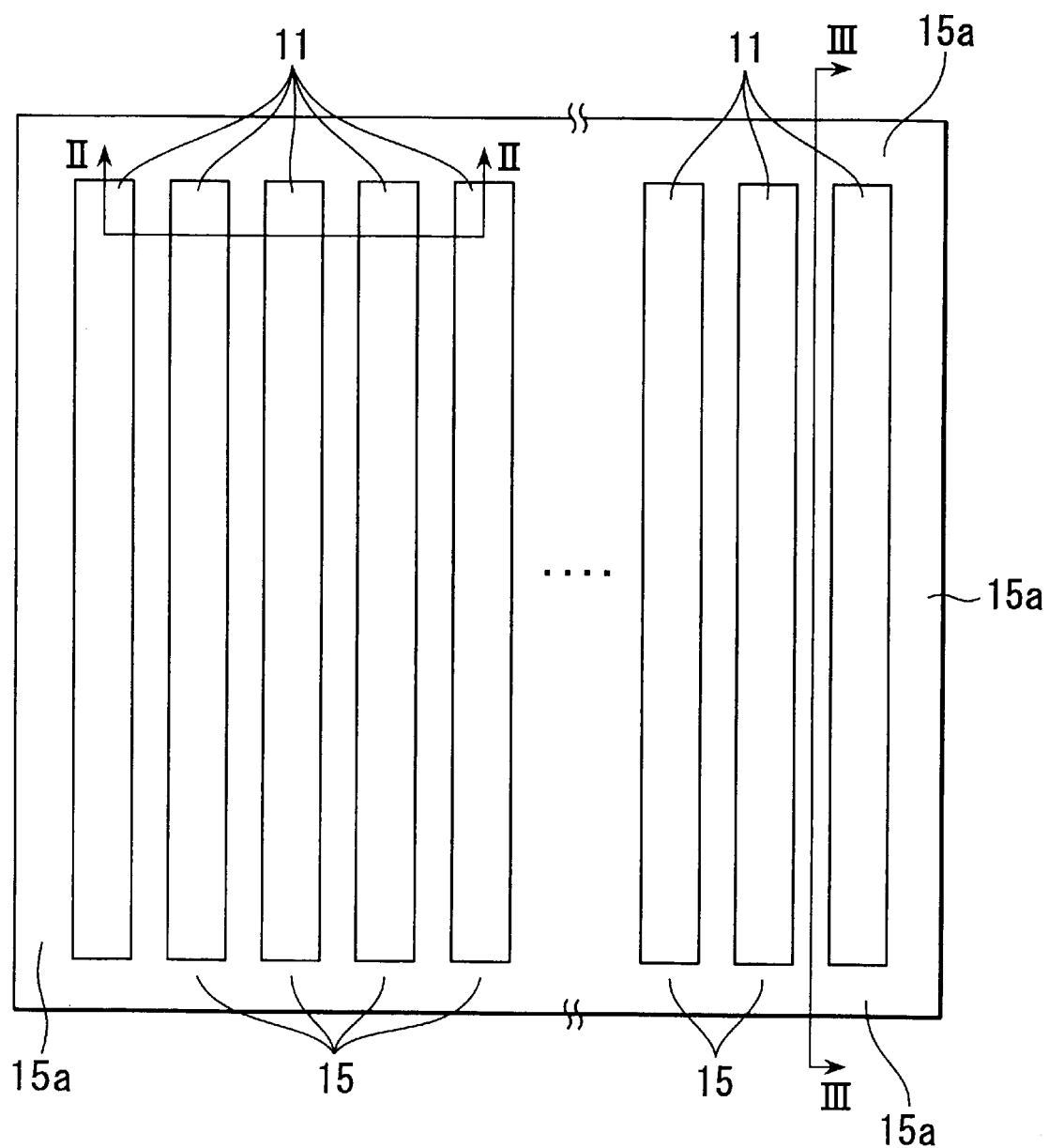
FIG. 1 is a plan view showing a semiconductor element according to the first embodiment of the present invention.

Embodiments of the present invention will be described below with reference to the views of the accompanying drawing. The same reference numerals denote the same portions throughout the views of the drawing.

[First Embodiment]

The first embodiment exemplifies a buried type power MOSFET.

The first characteristic feature of the first embodiment will be described first. The first characteristic feature is that a trench is formed in a drift layer, and a buried electrode to which a voltage independent of the voltage applied to a gate electrode is applied is formed in the trench.

Figure 2:
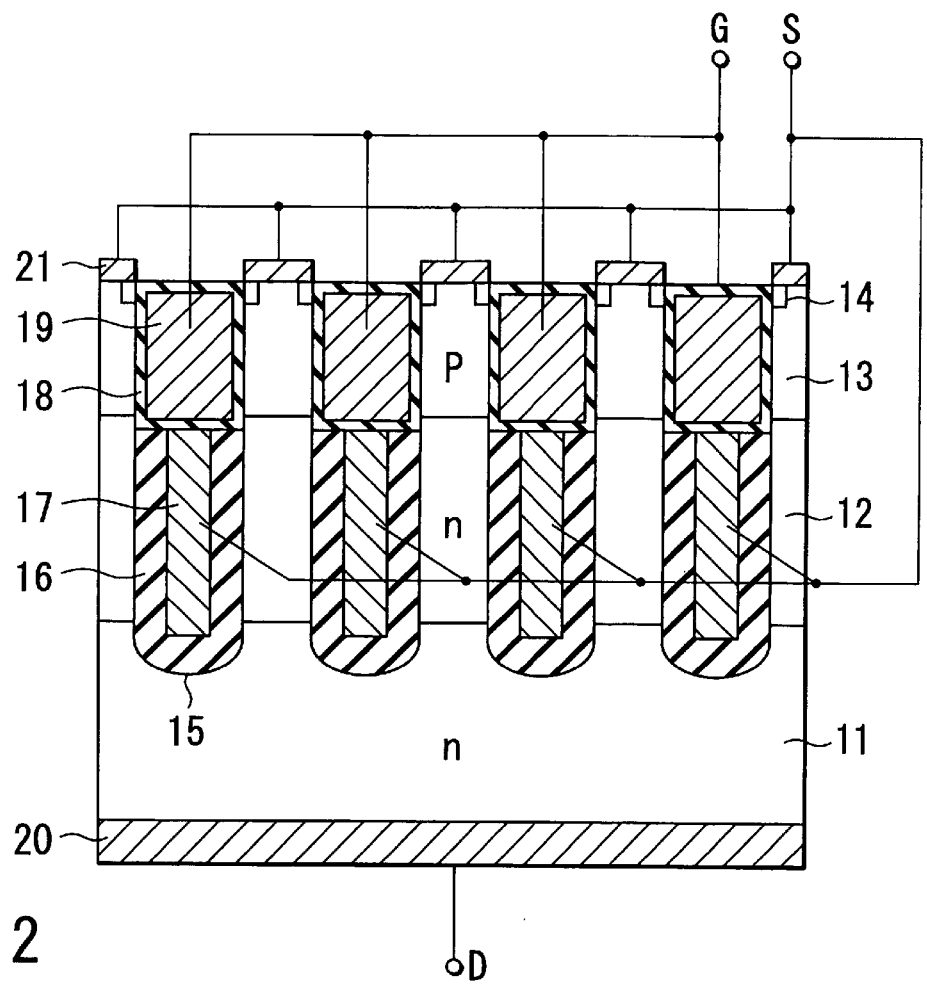
FIG. 2 is a sectional view taken along a line II—II of the semiconductor element in FIG. 1.
Figure 3:
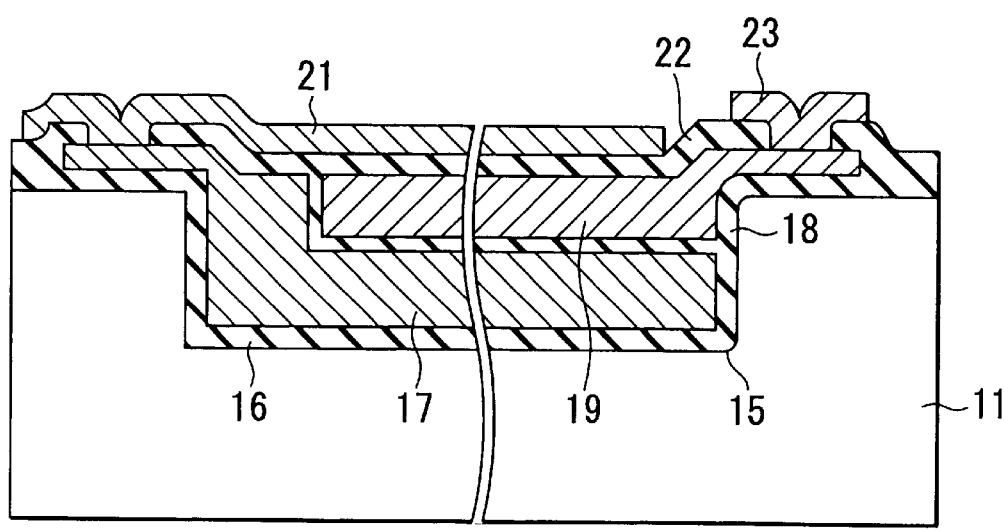
FIG. 3 is a sectional view taken along a line III—III of the semiconductor element in FIG. 1.
Figure 4:
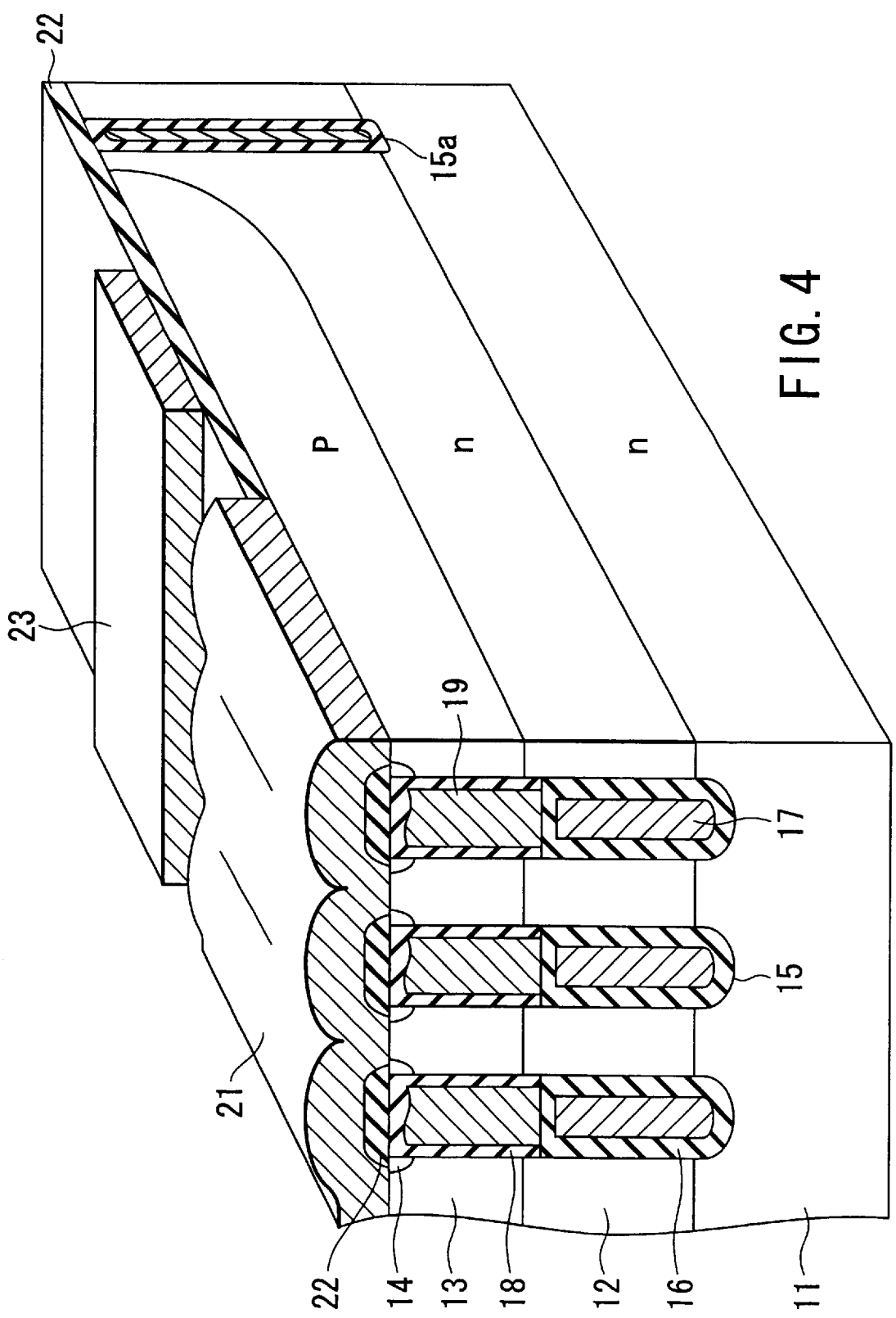
FIG. 4 is a perspective view showing the semiconductor element according to the first embodiment of the present invention.

FIG. 1 is a plan view of a semiconductor element according to the first embodiment of the present invention. FIG. 2 is a sectional view taken along a line II—II of the semiconductor element in FIG. 1. FIG. 3 is a sectional view taken along a line III—III of the semiconductor element in FIG. 1. FIG. 4 is a perspective view of the semiconductor element according to the first embodiment.

As shown in FIG. 1, a plurality of striped (belt-like) trenches 15 are formed in a semiconductor substrate 11. In addition, a terminal trench 15a is formed in a terminal portion of the element.

As shown in FIG. 2, an n-type drift layer 12 is formed on one surface of the n-type semiconductor substrate 11 by epitaxial growth. P-type well layers 13 for MOS formation are selectively formed in the surface of the drift layer 12. N-type source layers 14 are selectively formed in the surfaces of the well layers 13.

Each trench 15 is formed to reach the inside of the semiconductor substrate 11 from the surface of the source layer 14 through the well layer 13 and drift layer 12. A buried electrode 17 is formed through a first insulating film 16 in a region extending from the drift layer 12 to the semiconductor substrate 11 in this trench 15. A gate electrode 19 that is electrically insulated from the buried electrode 17 and serves as a control electrode is formed through a second insulating film 18 in a region extending from the source layer 14 to the drift layer 12 through the well layer 13 in the trench 15.

A drain electrode 20 serving as a first main electrode is formed on the other surface of the semiconductor substrate 11. Source electrodes 21 that are connected to the source layers 14 and well layers 13 and serve as second main electrodes are formed on the well layers 13.

In the semiconductor element having this structure, as shown in FIGS. 3 and 4, the buried electrode 17 is connected to the source electrode 21. The gate electrode 19 is insulated from the buried electrode 17 and source electrode 21 by an interlevel dielectric film 22 and connected to an overlying extraction gate electrode 23. As shown in FIG. 4, the terminal trench 15a shown in FIG. 1 is formed in a terminal portion.

In the buried type power MOSFET described above, the voltage applied to each buried electrode 17 is controlled to optimize the tradeoff between the breakdown voltage and ON resistance of the element.

When the ON resistance is to be reduced by increasing the impurity concentration of the drift layer 12, the buried electrode 17 is preferably connected to the source electrode 21 and fixed to the source potential, as shown in FIGS. 2 and 3. Note that the buried electrode 17 may be connected to the drain electrode 20 and fixed to the drain potential or may not be electrically connected.

Each trench 15 may not be formed to reach the semiconductor substrate 11.

The first and second insulating films 16 and 18 may be the same insulating film such as a silicon oxide film ($SiO_2$ film). The first and second insulating films 16 and 18 may be different insulating films. In this case, for example, the first insulating film 16 may be formed by an $SiO_2$ film, and the second insulating film 18 may be formed by an $SiO_2$ film/$Si_3N_4$ film/$SiO_2$ film (ONO film).

The first insulating film 16 is preferably thicker than the second insulating film 18. The thickness of the first insulating film 16 may be determined by a breakdown voltage, whereas the thickness of the second insulating film 18 may be determined by a threshold voltage. For example, the thickness of the first insulating film 16 is preferably larger than the value obtained by multiplying the static breakdown voltage of the element by 20 Å and may be set to 3,000 Å. The thickness of the second insulating film 18 may be set to, for example, 400 to 450 Å.

The drift layer 12 described above is a semiconductor layer in which depletion develops with an increase in drain voltage to mainly hold an applied voltage.

A method of forming a buried type power MOSFET according to the first embodiment will be described next with reference to FIGS. 5 to 13.

Figure 5:
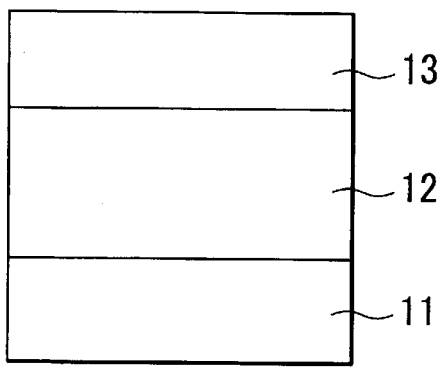
FIGS. 5, 6, 7, 8, 9, 10, 11, 12, and 13 are sectional views showing the steps in manufacturing the semiconductor element according to the first embodiment of the present invention.

As shown in FIG. 5, the n-type drift layer 12 is formed on the surface of the n-type semiconductor substrate 11 by epitaxial growth. The p-type well layers 13 are selectively formed in the surface of the drift layer 12. An n-type source layer (not shown) is selectively formed in the surface of the well layer 13.

Figure 6:
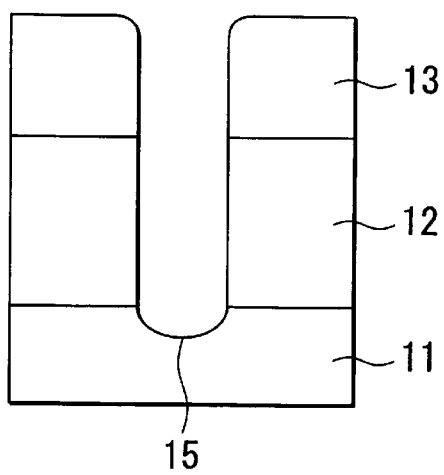

As shown in FIG. 6, the trench 15 is formed to reach the inside of the semiconductor substrate 11 from the surface of the source layer through the well layer 13 and the drift layer 12 by RIE (Reactive Ion Etching).

Figure 7:
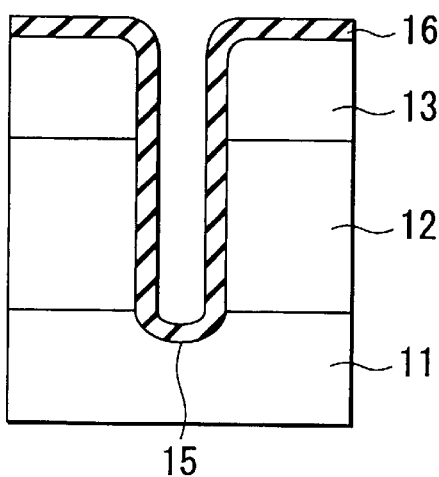

As shown in FIG. 7, the first insulating film 16 having a thickness of, for example, 3,000 Å is formed on the exposed surface of the trench 15 and the surface of the well layer 13 by, for example, thermal oxidation.

Figure 8:
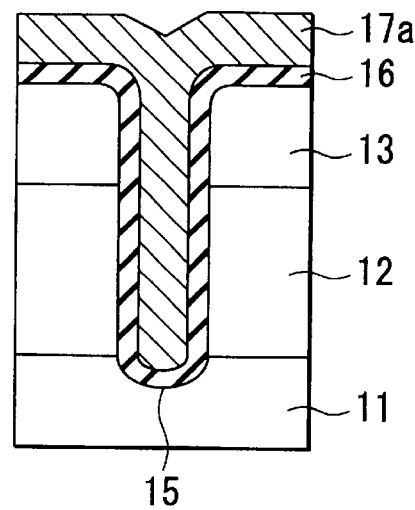

As shown in FIG. 8, a first polysilicon film 17a is formed on the first insulating film 16 to fill the trench 15.

Figure 9:
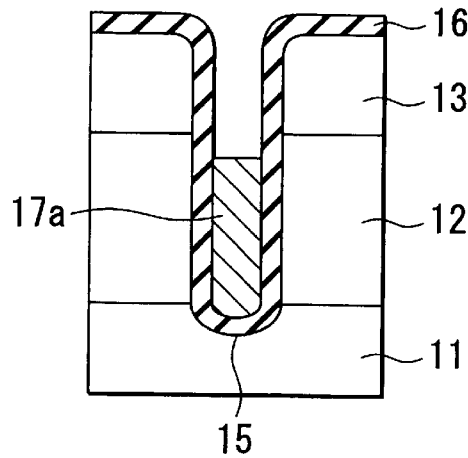
Figure 10:
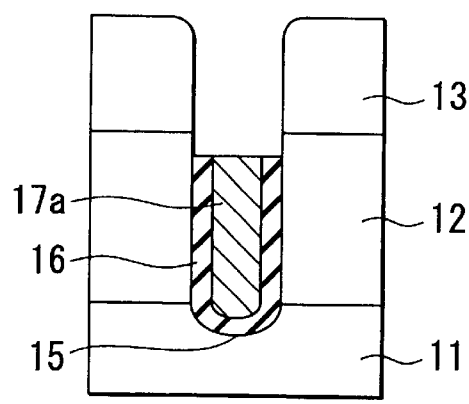

As shown in FIG. 9, the first polysilicon film 17a is etched back, and the etched-back surface of the first polysilicon film 17a is located below the surface of the well layer 13. Thereafter, as shown in FIG. 10, the first insulating film 16 is etched to the etched-back surface of the first polysilicon film 17a. Note that the first polysilicon film 17a and first insulating film 16 may be removed at once.

Figure 11:
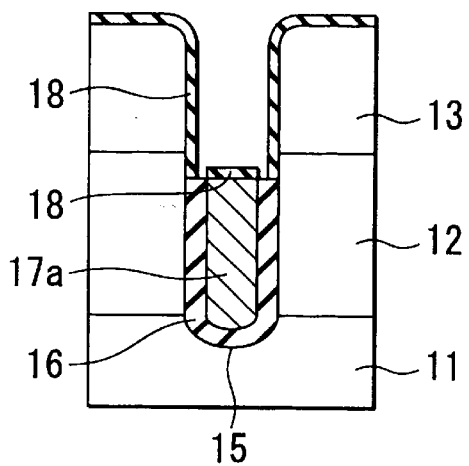

As shown in FIG. 11, the second insulating film 18 having a thickness of, for example, 400 to 450 Å is formed on the exposed surface of the trench 15 and the surfaces of the well layers 13 and first polysilicon film 17a by, for example, thermal oxidation. Note that the second insulating film 18 may be formed by deposition.

Figure 12:
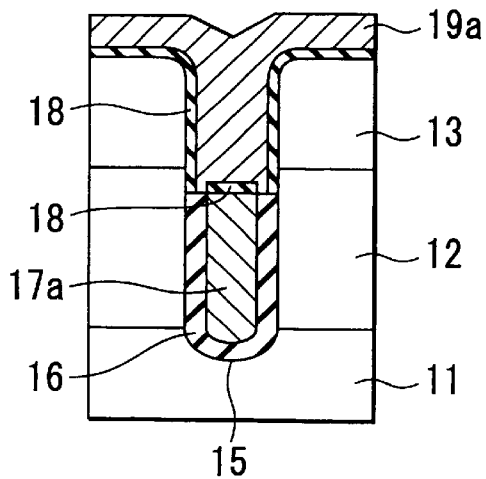

As shown in FIG. 12, a second polysilicon film 19a is formed on the second insulating film 18 to fill the trench 15.

Figure 13:
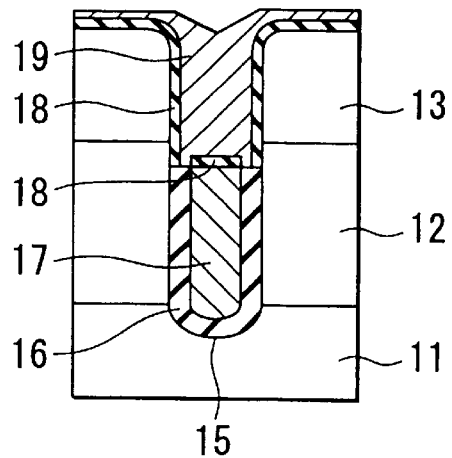

As shown in FIG. 13, the second polysilicon film 19a is etched back to expose the surface of the second insulating film 18. As a result, the buried electrode 17 and the gate electrode 19 insulated from the buried electrode 17 are formed in the trench 15.

As described above, the first characteristic feature of the present invention is that the trench 15 is formed in the drift layer 12, and the buried electrode 17 to which a voltage independent of the voltage applied to the gate electrode 19 is applied is formed in the trench 15.

In general, if a drift layer is heavily doped, a large amount of spatial charge is generated with slight depletion. For this reason, with a rise in drain voltage, the electric field steeply increases in strength and exceeds the critical value. As a consequence, the element breaks down.

According to the first characteristic feature described above, however, since the positive charge generated in the drift layer 12 cancels out the negative charge induced in the surface of the buried electrode 17, the drift layer 12 can be greatly depleted. Even if, therefore, the drift layer 12 is heavily doped, a high breakdown voltage can be realized. Since the energy consumed by the power MOSFET while a current flows decreases, the efficiency of the power supply can be improved.

Owing the first characteristic feature, even if the drift layer 12 is heavily doped as indicated by Table 1, a high breakdown voltage can be attained.

TABLE 1

| Breakdown Voltage (V) | Impurity Concentration (× 10$^{18}$ atom/cm$^3$) |
| --- | --- |
| 50 | 5.0 |
| 100 | 2.5 |
| 200 | 1.2 |

Table 2 shows the relationship between the width of the drift layer 12 and the maximum impurity concentration. As indicated by Table 2, the maximum impurity concentration of the drift layer 12 is determined by the width of the drift layer 12 between the trenches 15. Note that the maximum impurity concentration of the drift layer 12 is the impurity concentration of a portion where depletion has developed at the maximum breakdown voltage of the element.

TABLE 2

| Width of Drift Layer (μm) | Impurity Concentration (× 10$^{18}$ atom/cm$^3$) |
| --- | --- |
| 6.0 | 0.8 |
| 4.0 | 1.4 |
| 2.0 | 3.0 |
| 1.0 | 7.0 |
| 0.8 | 9.0 |
| 0.6 | 13.0 |
| 0.4 | 22.0 |
| 0.2 | 60.0 |

As described above, the maximum impurity concentration of the drift layer 12 can be increased by decreasing the width of the drift layer 12 between the trenches 15. This makes it possible to further reduce the ON resistance.

The second characteristic feature of the first embodiment will be described next. The second characteristic feature is that the voltage held by only a semiconductor layer in the prior art is shared by the first insulating layer on the surface of the electrode buried in each trench.

Figure 14A:
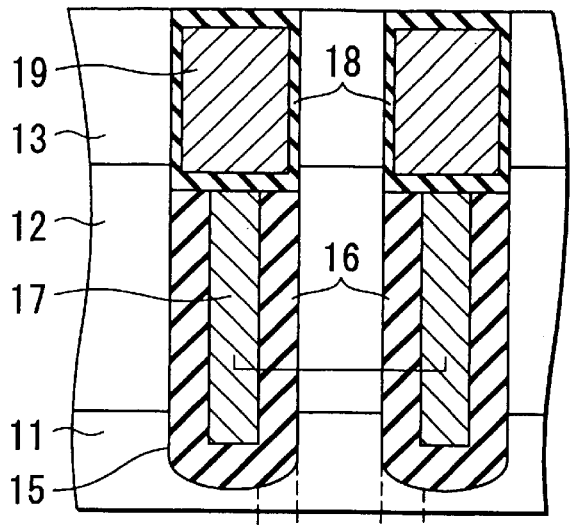
FIG. 14A is a sectional view showing a semiconductor element according to the first embodiment of the present invention.
Figure 14B:
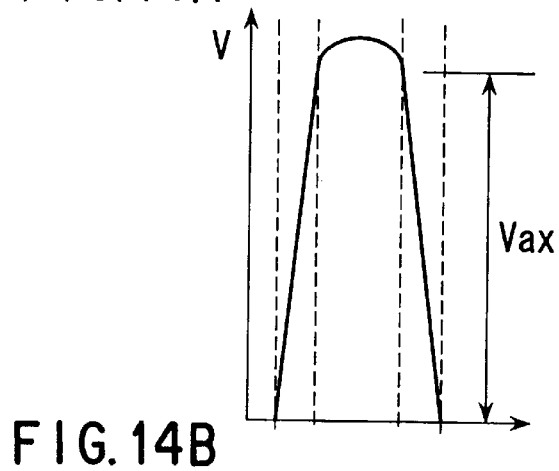
FIGS. 14B and 14C are views showing the relationship between the voltage and the drift layer between trenches.
Figure 14C:
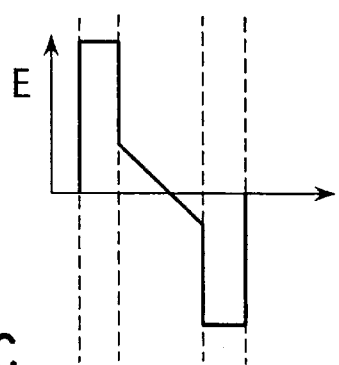

FIGS. 14B and 14C shows the relationship between the voltage and the drift layer between trenches. As shown in FIGS. 14B and 14C, the buried electrode 17 is formed in the trench 15 through the first insulating film 16. This first insulating film 16 is formed thick, as described above. In the first insulating film 16 in the trench 15, a voltage V in the drift layer 12 is decreased. In the first insulating film 16, a strong electric field E is generated.

According to the second characteristic feature, the voltage held by only a semiconductor layer in the prior art is shared by the first insulating film 16 on the surface of the buried electrode 17 in the trench 15. Therefore, the voltage applied to the semiconductor layer can be greatly decreased as compared with the total drain voltage. This makes it possible to increase the breakdown voltage. The strong electric field which is generated when positive charge in the drift layer 12 is canceled out by negative charge in the buried electrode 17 can be generated in the first insulating film 16. Hence, the electric field can be suppressed relatively low in the semiconductor layer.

When a silicon substrate is used as the semiconductor substrate 11, and an oxide film is used as the first insulating film 16, since the dielectric constant of the oxide film is about ⅓ that of silicon, a voltage three times as high as that held by silicon can be held. As described above, if the dielectric constant of the first insulating film 16 surrounding the buried electrode 17 is set to be lower than that of the semiconductor substrate 11, the breakdown voltage can be further increased.

The third characteristic feature of the first embodiment will be described next. The third characteristic feature is that a drift layer has an impurity concentration distribution.

FIG. 15B shows the first impurity concentration distribution of the drift layer in the first embodiment. In this first impurity concentration distribution, as shown in FIG. 15B, the impurity concentration of the drift layer 12 increases toward the substrate 11.

According to the first impurity concentration distribution, the potential of the drift layer 12 rises toward the substrate 11, and the potential difference between the drift layer 12 and the buried electrode 17 increases. As a consequence, the negative charge in the buried electrode 17 increases. Therefore, the impurity concentration of the drift layer 12 can be increased toward the substrate 11. This makes it possible to decrease the ON voltage as compared with a structure in which the impurity concentration of the drift layer 12 is uniform.

Figure 16A:
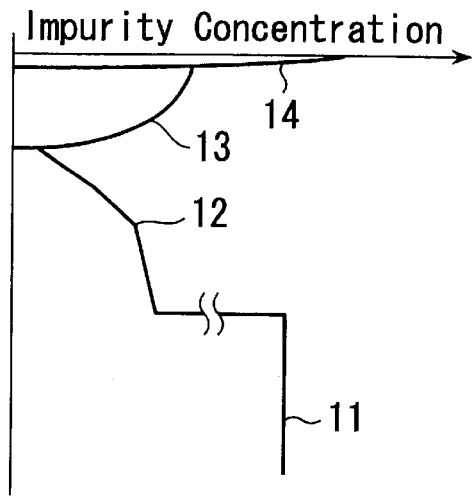
FIGS. 16A, 16B, and 16C are views showing other examples of the first impurity concentration distribution of the drift layer in the first embodiment.
Figure 16B:
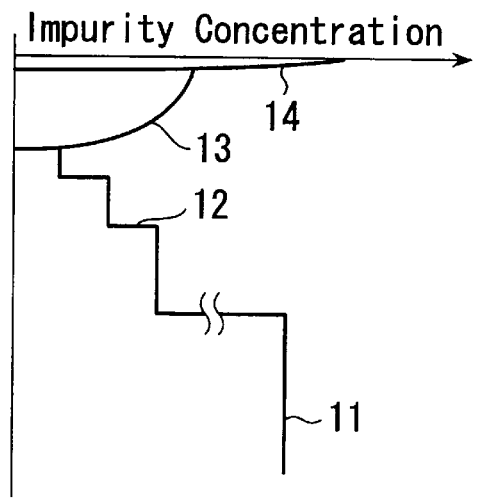
Figure 16C:
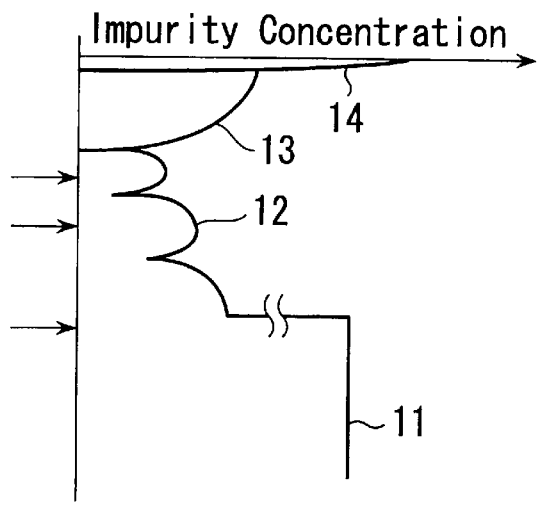

Note that the impurity concentration of the drift layer 12 need not be uniformly increased toward the substrate 11. For example, as shown in FIG. 16A, the impurity concentration of the drift layer 12 may be increased on average toward the substrate 11. As shown in FIG. 16B, in order to increase the impurity concentration of the drift layer 12 toward the substrate 11, the drift layer 12 may be formed by epitaxial growth while the gas concentration is changed, thereby changing the impurity concentration of the drift layer 12 stepwise. Alternatively, as shown in FIG. 16C, thermal diffusion may be performed after repetition of epitaxial growth and ion implantation to change the impurity concentration of the drift layer 12 stepwise so as to increase the impurity concentration of the drift layer 12 toward the substrate 11. In this case as well, as in the above case, the ON voltage can be decreased as compared with the structure in which the impurity concentration of the drift layer 12 is uniform.

The thickness of the first insulating film 16 on the surface of the buried electrode 17 may be increased toward the substrate 11 instead of changing the impurity concentration of the drift layer 12 in the above manner. In this case as well, the same effects as described above can be obtained.

Figure 17:
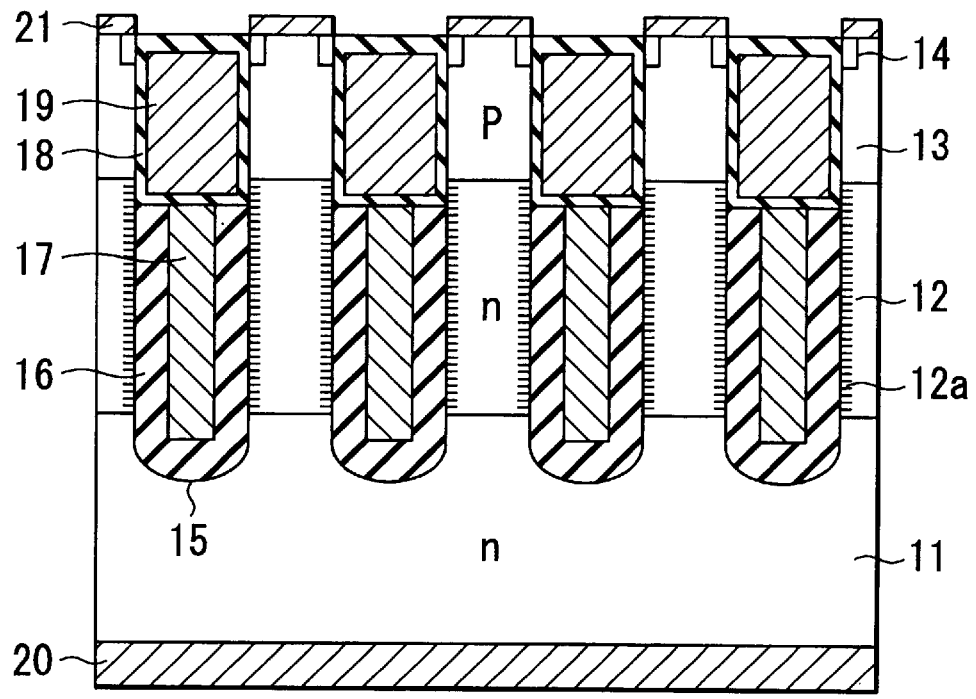
FIG. 17 is a view showing the second impurity concentration distribution of the drift layer in the first embodiment.

FIG. 17 shows the second impurity concentration distribution of the drift layer in the first embodiment.

According to the second impurity concentration distribution, as shown in FIG. 17, a heavily doped region 12a in which the impurity concentration of the drift layer 12 is high is formed near a side wall of the trench 15. This heavily doped region 12a is formed by obliquely implanting ions into a portion near a side wall of the trench 15 after the trench 15 is formed.

According to the second impurity concentration distribution, although the effects of the present invention can be expected by setting the impurity concentration of the drift layer 12 to a predetermined value, the effects can be enhanced by forming the heavily doped region 12a near a side wall of the trench 15. In this structure, the maximum impurity concentration of the drift layer 12 can be increased. Hence, the ON resistance can be further decreased.

Note that it suffices if the impurity concentration at the center line of the drift layer 12 is lower than the average impurity concentration of the drift layer 12. A great effect can be obtained, in particular, by forming the heavily doped region 12a in only a thin portion of the surface of the side wall of the trench 15.

As described above, according to the third characteristic feature, by making the drift layer 12 have an impurity concentration distribution, the ON voltage and ON resistance can be further decreased as compared with the structure in which the impurity concentration of the drift layer 12 is uniform.

According to the first embodiment having the first to third characteristic features, the ON resistance can be decreased, and the breakdown voltage can be increased. IN addition, a decrease in ON voltage can also be attained.

In the first embodiment described above, the buried electrode 17 may be connected to the gate electrode 19. In this case, improvements in ON resistance and breakdown voltage can be expected more than in the above embodiment. This is because, in an ON state, the buried electrode 17 also serves as a MOS gate, and an electron storage layer is formed at the interface between the drift layer 12 and the trench 15 to promote conduction of electrons. In this structure, fixing the buried electrode 17 to the high voltage of the gate or a higher voltage can prevent the feedback capacitance of the gate from increasing and prevent the switching speed from decreasing.

Also, the n-type drift layer 12 may be a p-type layer. In this case, the impurity concentration of the n-type heavily doped region 12a can be increased. Hence, the ON resistance can be further decreased.

[Second Embodiment]

In the second embodiment, the first and third characteristic features of the first embodiment are applied to a planar type power MOSFET. A description of structures common to the first embodiment will be omitted, and only different structures will be described.

Figure 18:
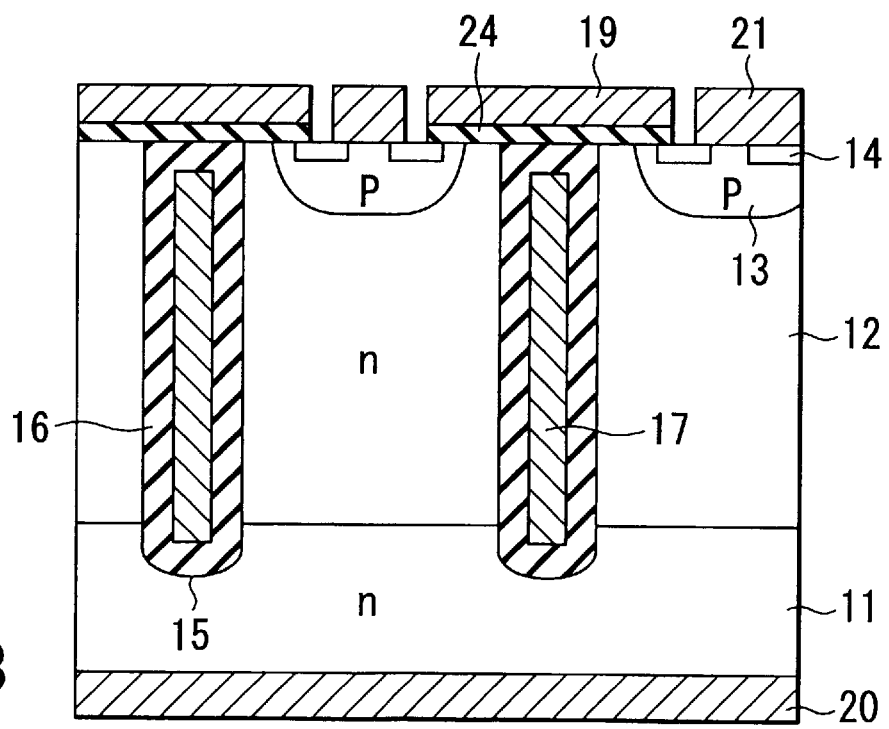
FIG. 18 is a sectional view showing a semiconductor element according to the second embodiment of the present invention.

FIG. 18 is a sectional view of a semiconductor element according to the second embodiment of the present invention.

As shown in FIG. 18, an n-type drift layer 12 is formed on one surface of an n-type semiconductor substrate 11 by epitaxial growth. P-type well layer 13 for MOS formation are selectively formed in the surface of the drift layer 12. N-type source layers 14 are selectively formed in the surfaces of the well layers 13.

Trenches 15 are formed to reach the inside of the semiconductor substrate 11 from the surface of the drift layer 12 through the drift layer 12. A buried electrode 17 is formed in each trench 15 through a first insulating film 16. A gate electrode 19 serving as a control gate is formed on the drift layer 12 through a gate insulating film 24.

A drain electrode 20 serving as a first main electrode is formed on the other surface of the semiconductor substrate 11. A source electrode 21 serving as a second main electrode which is insulated from the gate electrode 19 and connected to the source layer 14 and well layer 13 is formed on the well layer 13.

In this case, the first insulating film 16 is formed relatively thick and made of, for example, an $SiO_2$ film as in the first embodiment. The buried electrode 17 may be connected to the drain electrode 20 or source electrode 21 or may not be connected thereto. The trench 15 may not be formed to reach the semiconductor substrate 11.

According to the second embodiment, the same effects as those of the first embodiment can be obtained. As compared with a buried type MOSFET, a planar type MOSFET has no gate electrode 19 formed in the trench 15, and hence facilitates the manufacturing process.

Note that a planar type power MOSFET having the following structure can obtain the same effects as those of the power MOSFET shown in FIG. 18.

Figure 19:
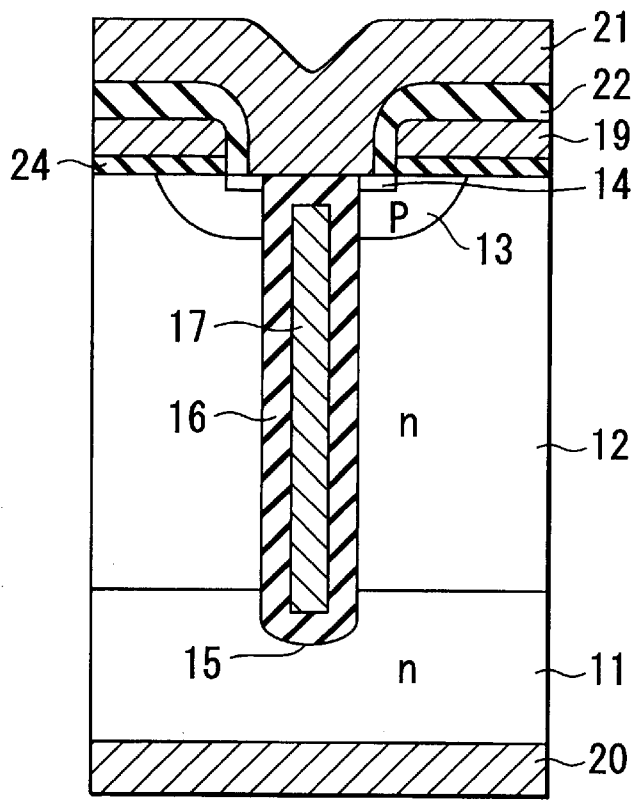
FIG. 19 is a sectional view showing still another semiconductor element according to the second embodiment of the present invention.

For example, as shown in FIG. 19, the well layers 13 and source layers 14 may be formed on two upper ends of the trench 15, and the source electrode 21 may be formed on the trench 15. In this case, a reduction in size can be attained as compared with the power MOSFET shown in FIG. 18.

Figure 20:
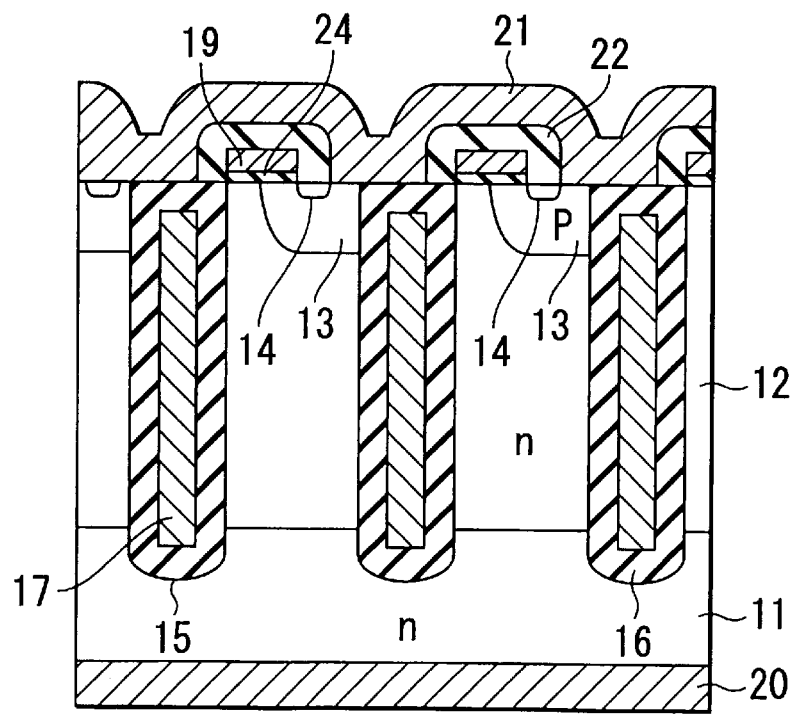
FIG. 20 is a sectional view showing still another semiconductor element according to the second embodiment of the present invention.

As shown in FIG. 20, the well layer 13 and source layer 14 may be formed on one upper end of the trench 15, and the source electrode 21 may be formed on the trench 15. In this case, the distance between the trenches 15 can be decreased. The impurity concentration of the drift layer 12 can therefore be increased as compared with the power MOSFET shown in FIG. 18. This makes it possible to further decrease the ON resistance. In addition, according to the structure shown in FIG. 20, a reduction in size can be attained as compared with the power MOSFET shown in FIG. 18.

[Third Embodiment]

In the third embodiment, the first to third characteristic features of the first embodiment are applied to a Schottky barrier diode. A description of structures common to the first embodiment will be omitted, and only different structures will be described.

Figure 21:
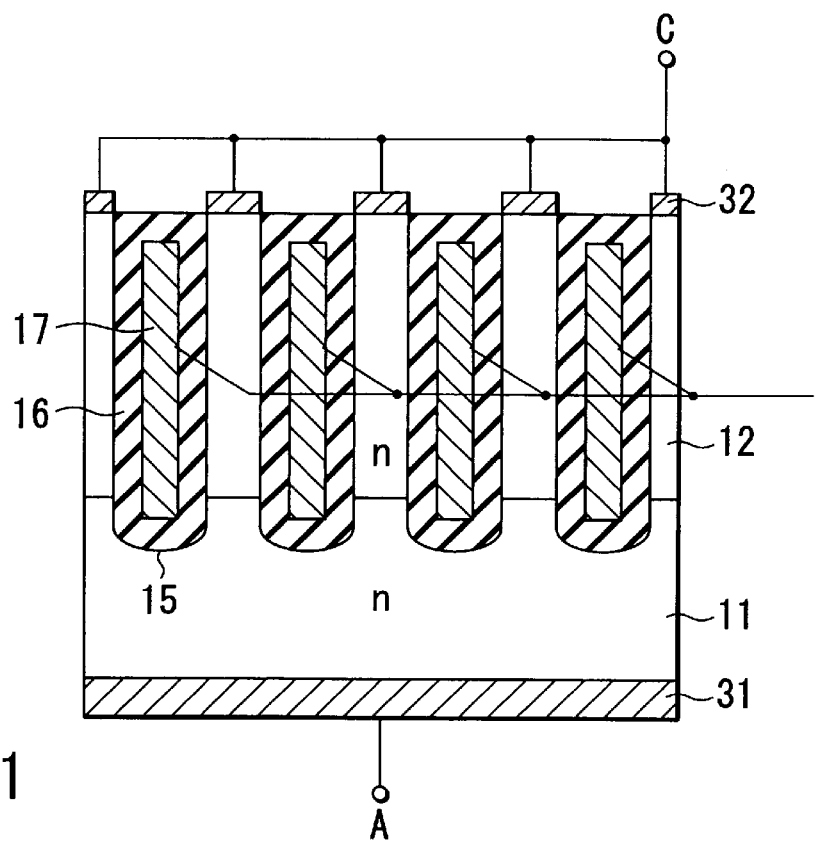
FIG. 21 is a sectional view showing a semiconductor element according to the third embodiment of the present invention.

FIG. 21 is a sectional view of a semiconductor element according to the third embodiment.

As shown in FIG. 21, an n-type drift layer 12 is formed on one surface of an n-type semiconductor substrate 11 by epitaxial growth. Trenches 15 are formed to reach the inside of the semiconductor substrate 11 from the surface of the drift layer 12 through the drift layer 12. A buried electrode 17 is formed in each trench 15 through a first insulating film 16.

An anode electrode 31 serving as a first main electrode is formed on the other surface of the semiconductor substrate 11. Cathode electrodes 32 serving as second main electrodes are formed on the drift layer 12.

In this case, the first insulating film 16 is formed relatively thick and made of, for example, an $SiO_2$ film as in the first embodiment. The buried electrode 17 may be connected to the anode electrode 31 or cathode electrode 32 or may not be electrically connected thereto. Each trench 15 may not be formed to reach the semiconductor substrate 11.

According to the third embodiment, the same effects as those of the first embodiment can be obtained. In addition, according to a Schottky barrier diode, in a switching power supply, synchronous rectification by the MOSFET can be replaced with a diode having a simple structure.

Note that the present invention can also be applied to an IGBT (Insulated Gate Bipolar Transistor), SIT (Static Induction Transistor), and the like.

[Fourth Embodiment]

In the fourth embodiment, the shape of each trench in the first to third embodiments will be described. Each trench in the first to third embodiments may have a striped pattern like the one described above or may have the following shape.

Figure 22:
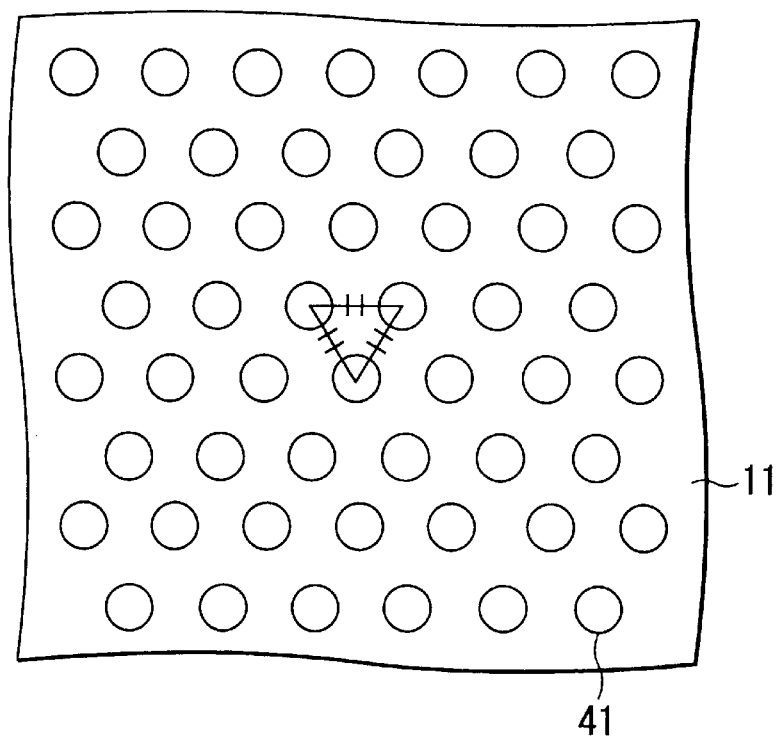
FIG. 22 is a plan view showing circular trenches according to the fourth embodiment.
Figure 23:
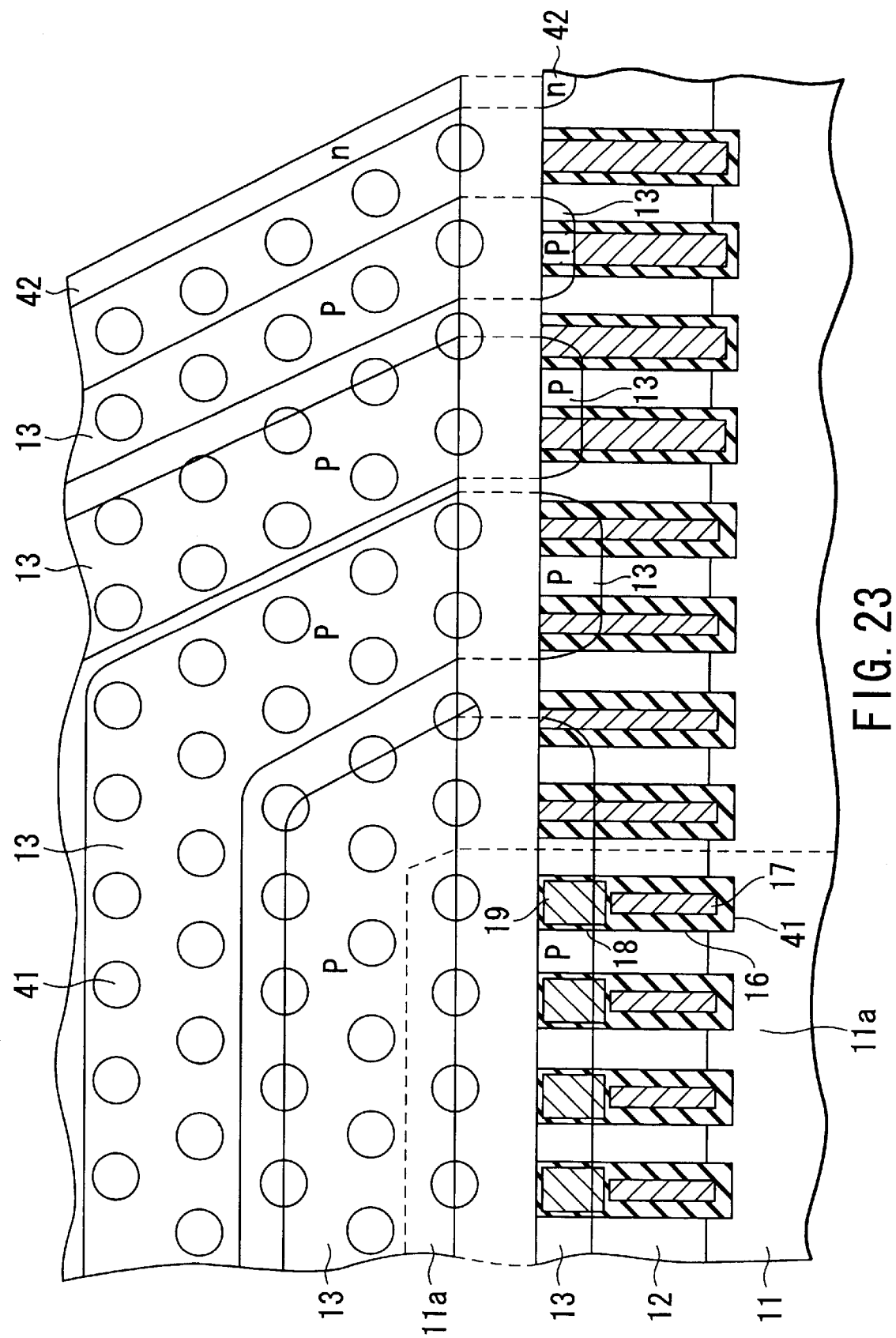
FIG. 23 is a sectional view and sectional view showing the circular trenches according to the fourth embodiment.

FIG. 22 is a plan view of a structure having circular trenches according to the fourth embodiment. FIG. 23 is a partially cutaway plan view of a terminal portion having trenches according to the fourth embodiment. For the sake of simplicity, FIG. 22 schematically shows only trenches at the planar position.

As shown in FIG. 22, a plurality of circular trenches 41 are formed in a semiconductor substrate 11 at the vertices of a regular triangle.

As shown in FIG. 23, in this embodiment, a guard ring structure is applied to the present invention, and an n-type diffusion layer 42 is formed at a terminal portion of this structure. Note that buried gates 17 in the terminal portion may be electrically connected to buried gates 17 in an element region 11a or set in a floating state.

As described above, the circular trenches 41 according to the fourth embodiment allow the structure to have high isotropy and maintain planar uniformity. This makes it difficult to unbalance an electric field in the planar direction, and reduces the possibility of breakdown due to a strong electric field. This structure is obtained by forming holes in the semiconductor substrate (silicon substrate) 11. As compared with the structure obtained by forming trenches 15 in a striped pattern, therefore, this structure can prevent troubles, e.g., collapse of silicon columns in forming the trenches 15.

Figure 24:
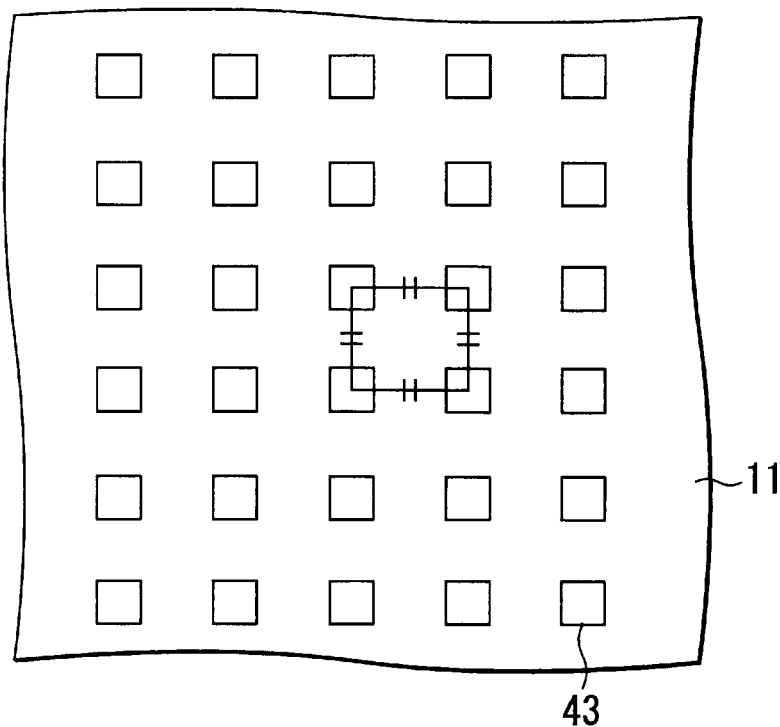
FIG. 24 is a plan view showing rectangular trenches according to the fourth embodiment.

As shown in FIG. 24, rectangular trenches 43 may be formed. In this case, planar uniformity can be maintained by forming rectangular trenches 43 in the semiconductor substrate 11 at the vertices of squares. With this structure, the same effects as those obtained by the circular trenches 41 described above can be obtained.

Figure 25:
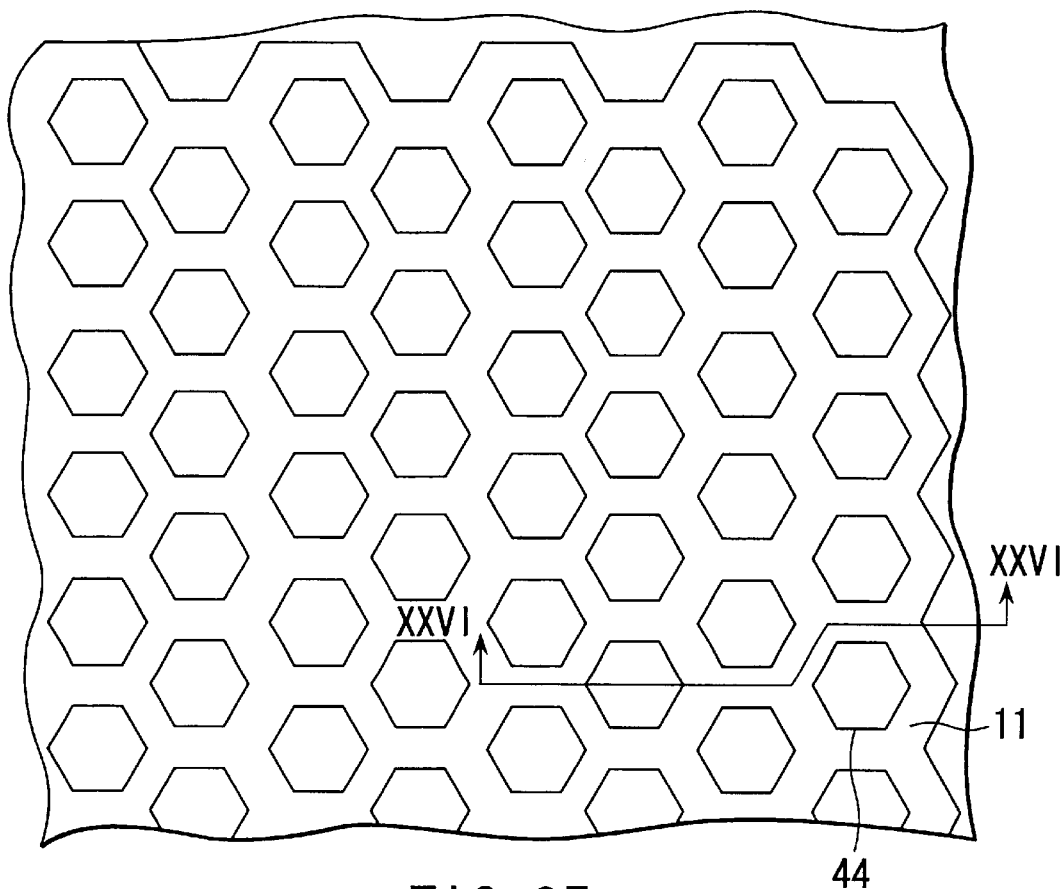
FIG. 25 is a plan view showing hexagonal trenches according to the fourth embodiment.
Figure 26:
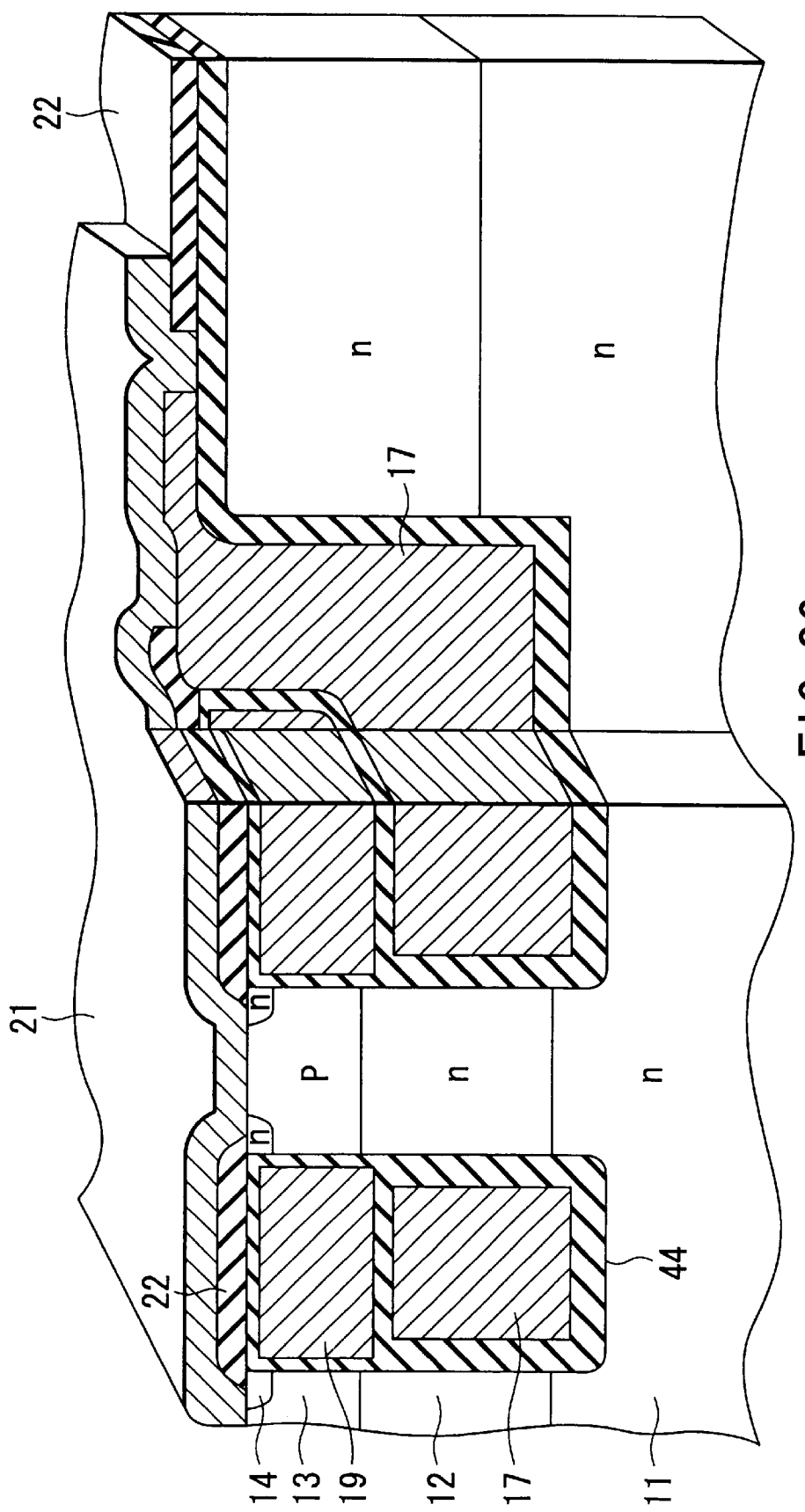
FIG. 26 is a sectional perspective view taken along a line XXVI—XXVI of a portion having trenches in FIG. 25.
Figure 27:
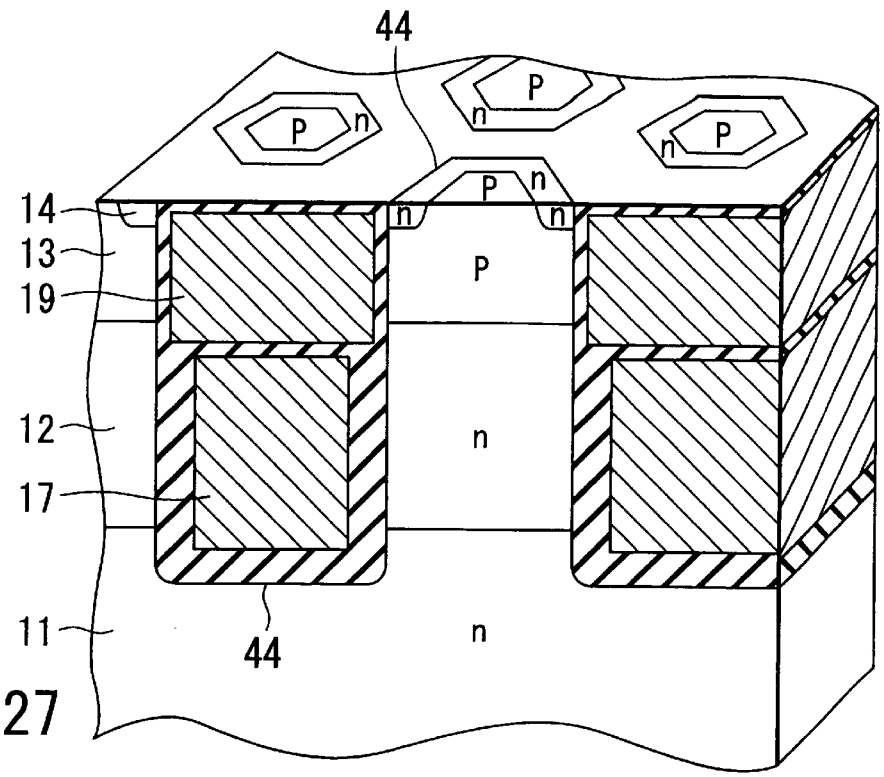
FIG. 27 is a perspective view showing a portion having hexagonal trenches according to the fourth embodiment.

FIG. 25 is a plan view of a structure having hexagonal trenches according to the fourth embodiment. FIG. 26 is a sectional perspective view taken along a line XXVI—XXVI of the trench structure in FIG. 25. FIG. 27 is a sectional perspective view of a portion having hexagonal trenches. For the sake of simplicity, FIG. 25 schematically shows only trenches at the planar position.

As shown in FIG. 25, a plurality of hexagonal trenches having a tortoise-shaped pattern are formed in the semiconductor substrate 11. As shown in FIG. 26, the buried electrode 17 in each trench 44 is connected to a source electrode 21.

As shown in FIG. 27, the trenches 44 surround element portions such as p-type well layers 13 and n-type source layers 14. At a terminal portion of this structure, therefore, the trenches 44 are naturally terminated. Note that the potential of each buried electrode 17 at the terminal portion is preferably set to be equal to that of each buried electrode 17 in the element region.

As described above, according to the hexagonal trenches 44 in the fourth embodiment, even if the width of a drift layer 12 sandwiched between the trenches 44 is large, effects similar to those obtained by decreasing the width of the drift layer 12 can be substantially obtained. Therefore, the performance of the element can be improved without reducing the element size.

[Fifth Embodiment]

The fifth embodiment exemplifies a buried type power MOSFET. This embodiment differs from the first embodiment in the first characteristic feature but has the same characteristic features as the second and third characteristic features. More specifically, in the first embodiment, a gate electrode and a buried electrode to which a voltage independent of the voltage applied to the gate electrode is applied are formed in the same trench formed in the drift layer. In contrast to this, in this embodiment, the gate electrode and buried electrode are formed in different trenches. In the fifth embodiment, a detailed description of structures common to the first embodiment will be omitted.

Figure 28:
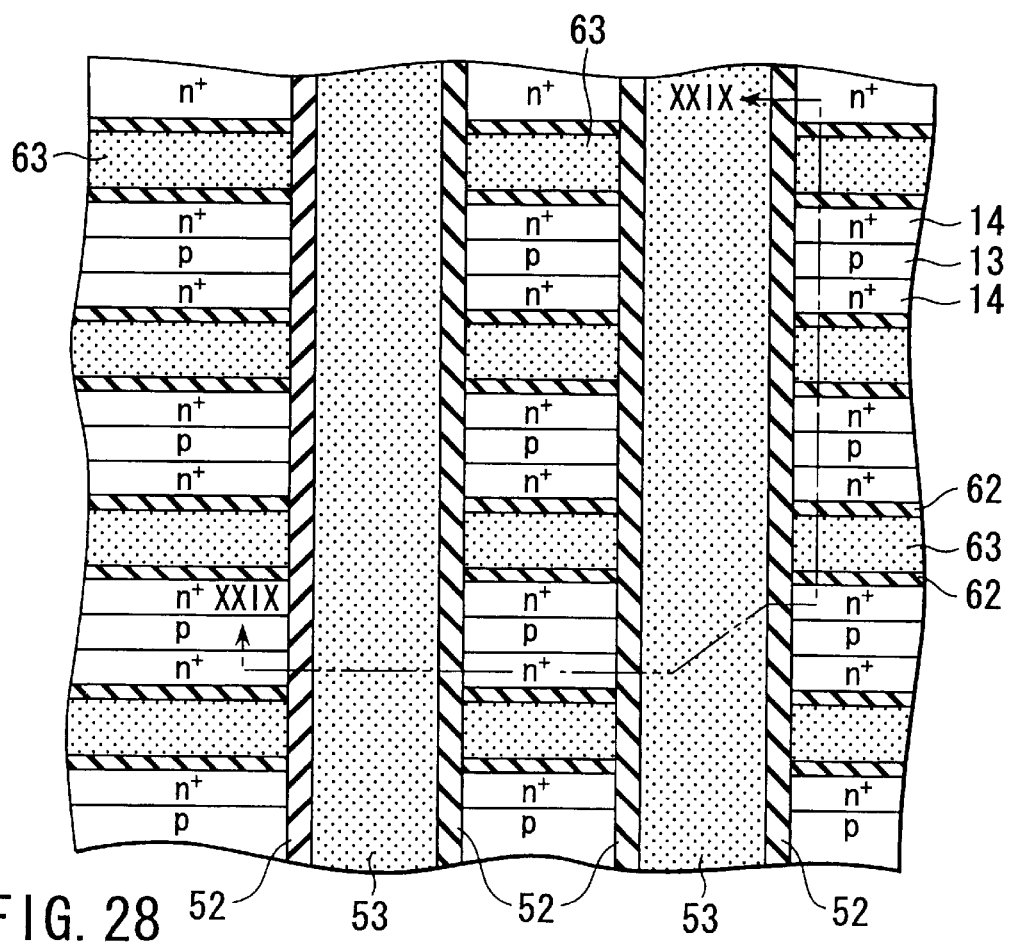
FIG. 28 is a plan view showing a semiconductor element according to the fifth embodiment of the present invention.
Figure 29:
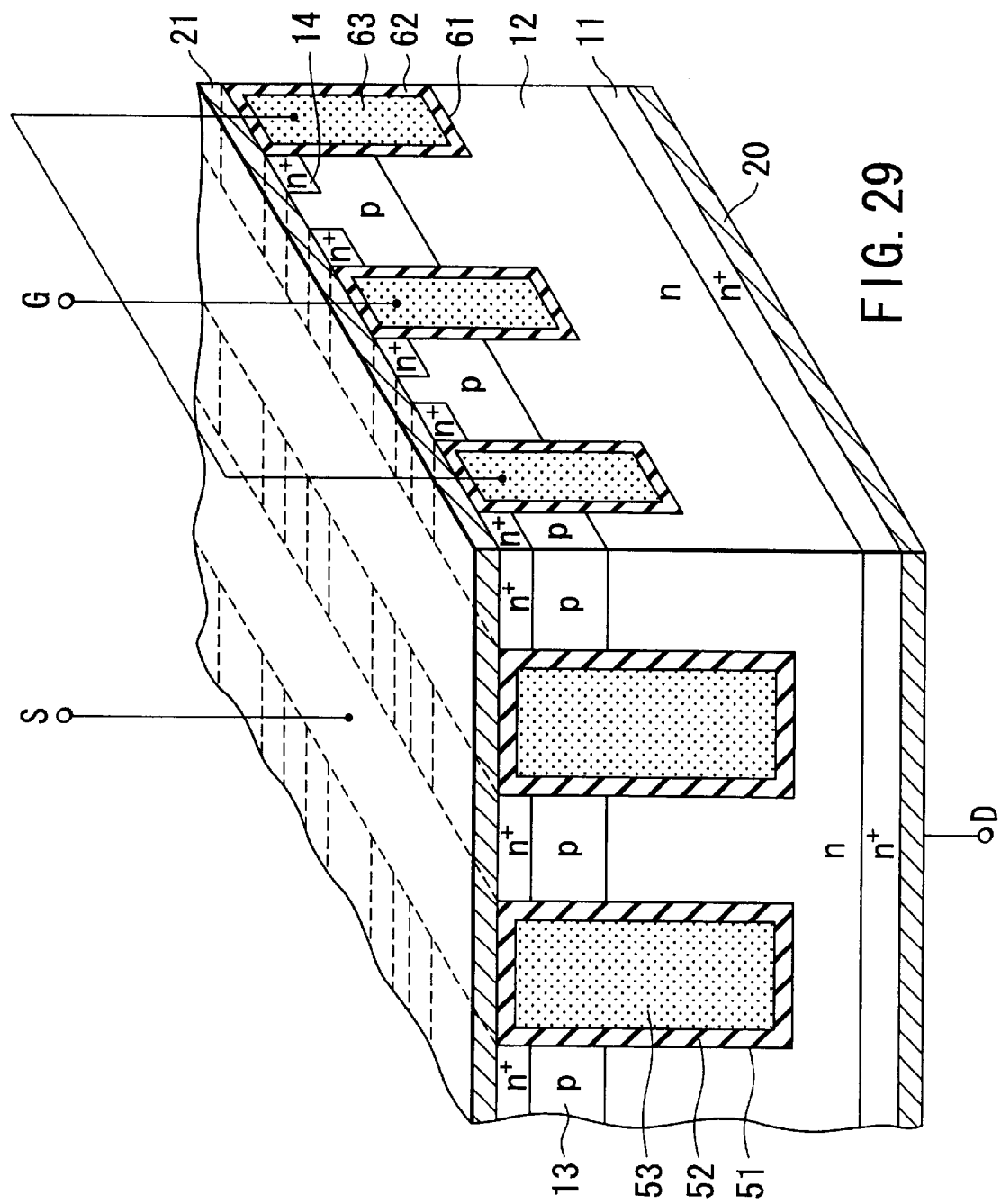
FIG. 29 is a sectional perspective view taken along a line XXVIII—XXVIII of the semiconductor element in FIG. 28.

FIG. 28 is a plan view of a semiconductor element according to the fifth embodiment of the present invention. Illustrations of source electrodes, insulating films, and the like are omitted from FIG. 28. FIG. 29 is a sectional perspective view taken along a line XXVIII—XXVIII of the semiconductor element in FIG. 28.

As shown in FIGS. 28 and 29, an n-type drift layer 12 is formed on one surface of an $n^+$-type semiconductor substrate 11. P-type wells 13 are formed in the surface of the drift layer 12. Striped $n^+$-type source layers 14 are selectively formed in the surfaces of the well layers 13 in the horizontal direction (lateral direction on the drawing).

A plurality of striped first trenches 51 are formed in the vertical direction (up-and-down direction on the drawing) to reach a portion in the drift layer 12 which is located near the semiconductor substrate 11 from the surfaces of the source layers 14 through the well layers 13. A buried electrode 53 is formed in each first insulating film 51 through a first insulating film 52 for holding a breakdown voltage.

A plurality of striped second trenches 61 are formed to reach the inside of the drift layer 12 from the surfaces of the source layers 14 through the well layers 13 so as to cross the first trenches 51, for example, at right angles. The second trench 61 is preferably formed to be shallower than the first trench 51. In each second trench 61, a gate electrode 63 serving as a control electrode is formed through a second insulating film 62 for forming a channel.

A drain electrode 20 is formed on the other surface of the semiconductor substrate 11. Source electrodes 21 connected to the source layers 14 and well layers 13 are formed on the well layers 13.

The buried electrode 53 is connected to the source electrode 21. The gate electrode 63 is insulated from the buried electrode 53 and source electrode 21 through an interlevel dielectric film, and is connected to an extraction gate electrode (not shown) on the upper layer.

As in the first embodiment, the voltage applied to each buried electrode 53 is controlled to optimize the tradeoff between the breakdown voltage and ON resistance of the element.

The first and second insulating films 52 and 62 may be the same insulating film such as a silicon oxide film ($SiO_2$ film). The first and second insulating films 52 and 62 may be different insulating films. In this case, for example, the first insulating film 52 may be formed by an $SiO_2$ film, and the second insulating film 62 may be formed by an $SiO_2$ film/$Si_3N_4$ film/ONO film.

The first insulating film 52 is preferably thicker than the second insulating film 62. The thickness of the first insulating film 52 may be determined by a breakdown voltage, whereas the thickness of the second insulating film 62 may be determined by a threshold voltage.

The impurity concentration of the drift layer 12 is preferably increased toward the semiconductor substrate 11.

A method of forming a buried type power MOSFET according to the fifth embodiment will be described next with reference to FIGS. 30 to 37.

Figure 30:
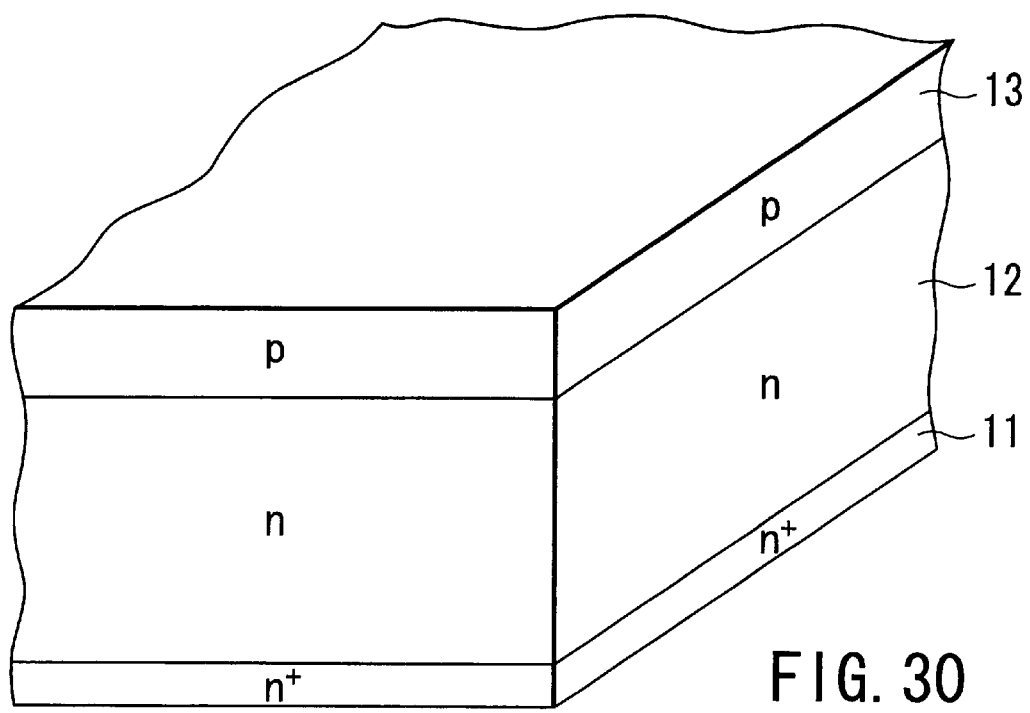
FIGS. 30, 31, 32, 33, 34, 35, 36, and 37 are perspective views showing the steps in manufacturing the semiconductor element according to the fifth embodiment of the present invention.
Figure 31:
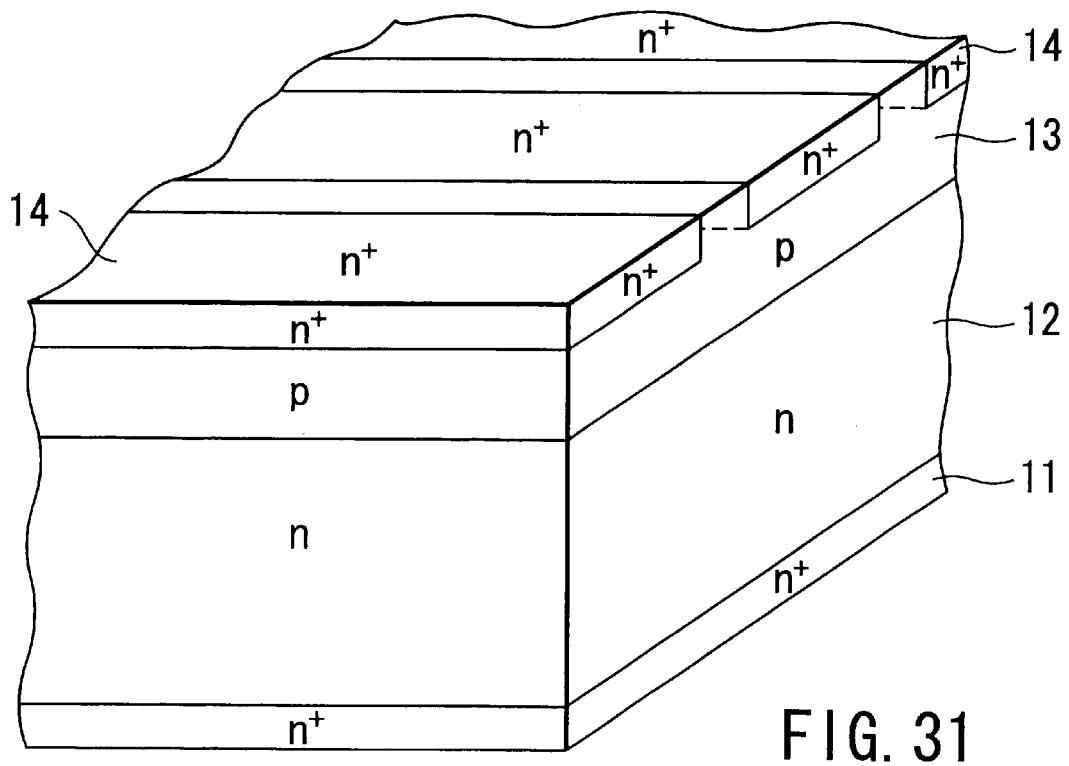

First of all, as shown in FIG. 30, the n-type drift layer 12 is formed on the surface of the $n^+$-type semiconductor substrate 11 by epitaxial growth. The p-type well layer 13 is formed in the surface of the drift layer 12. As shown in FIG. 31, the striped $n^+$-type source layers 14 are selectively formed in the surface of the well layer 13 at predetermined intervals in the horizontal direction.

Figure 32:
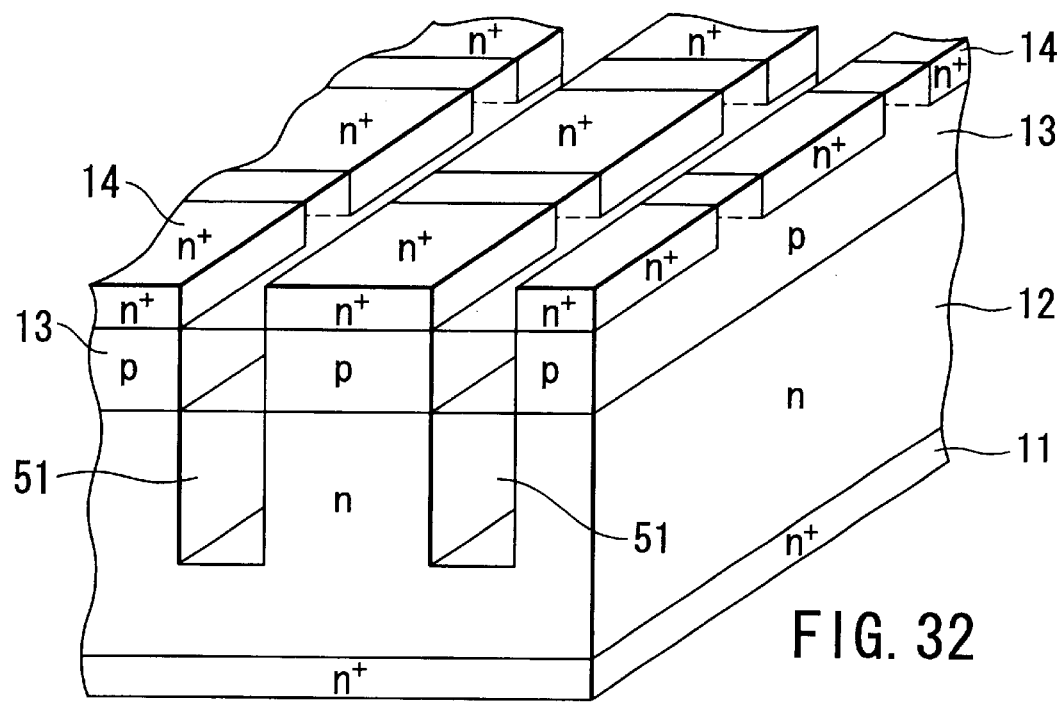

As shown in FIG. 32, the plurality of striped first trenches 51 are vertically formed across the source layers 14 by, for example, RIE. The first trenches 51 are formed to reach a portion in the drift layer 12 which is located near the semiconductor substrate 11 from the surface of the well layer 13 through the well layer 13.

Figure 33:
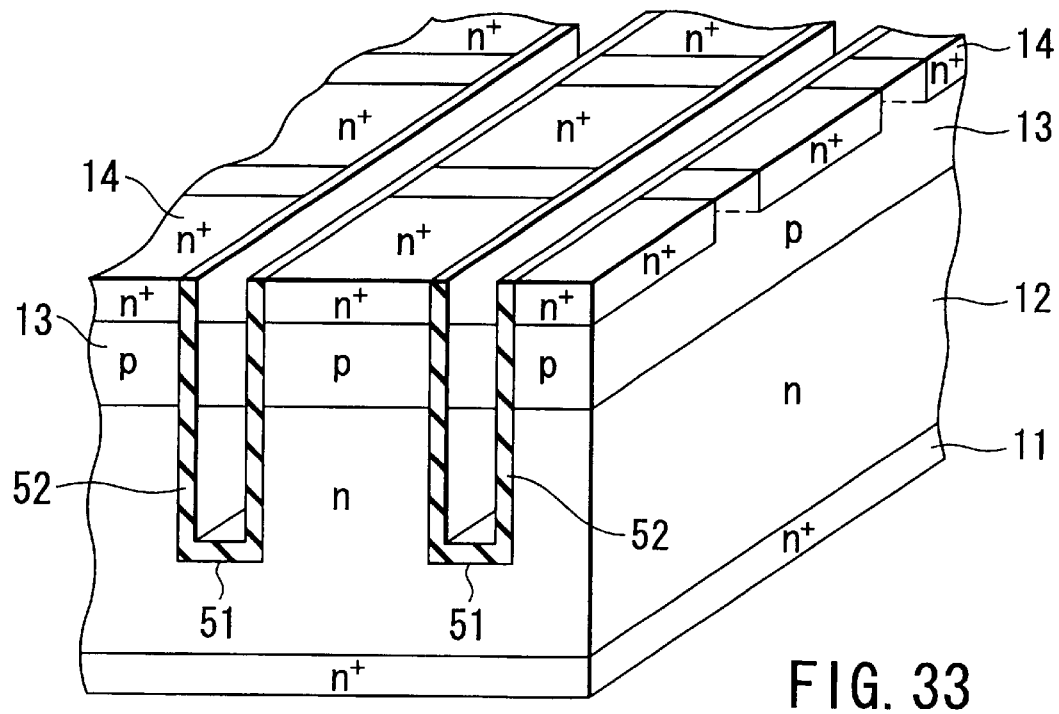

As shown in FIG. 33, the first insulating film 52 having a thickness of, for example, 3,000 Å to 30,000 Å is formed on the inner surface and bottom surface of each first trench 51 by, for example, thermal oxidation.

Figure 34:
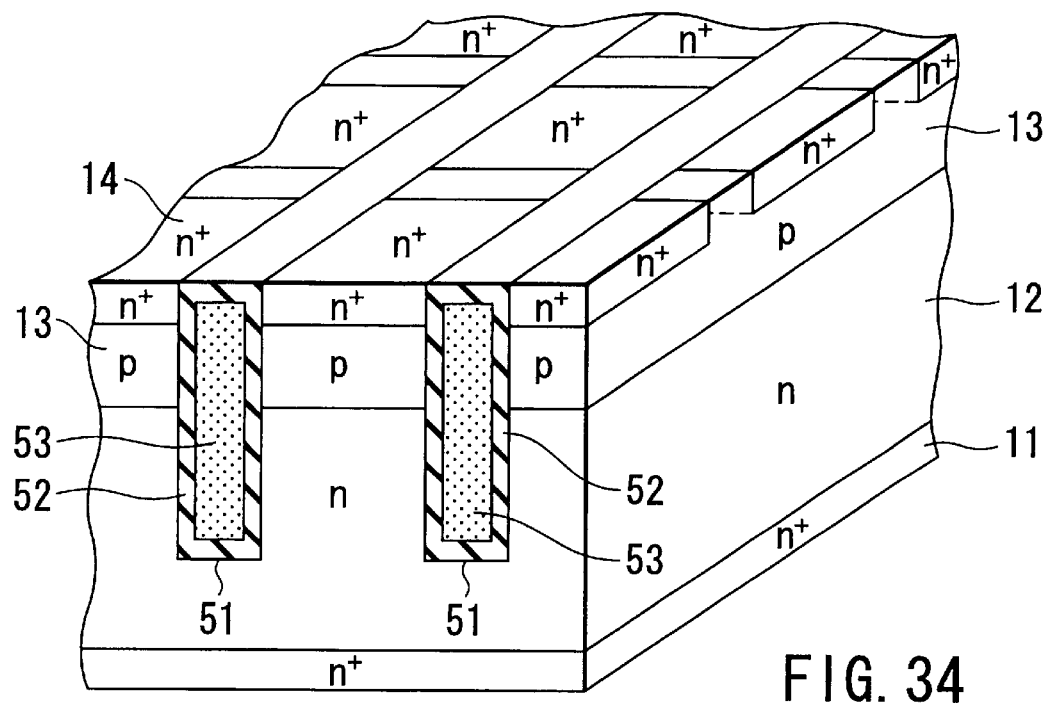

As shown in FIG. 34, a polysilicon film is formed in the first trench 51 and on the well layer 13 to fill the first trench 51. This polysilicon film is etched back such that the etched-back surface becomes flush with the surface of the well layer 13. Thereafter, the first insulating film 52 is formed on the surface of the polysilicon film on the upper portion of the first trench 51 by, for example, thermal oxidation. Note that the first insulating film 52 on the upper portion of the first trench 51 may be formed by deposition. As a result, the buried electrode 53 made of polysilicon is formed in the first trench 51.

Figure 35:
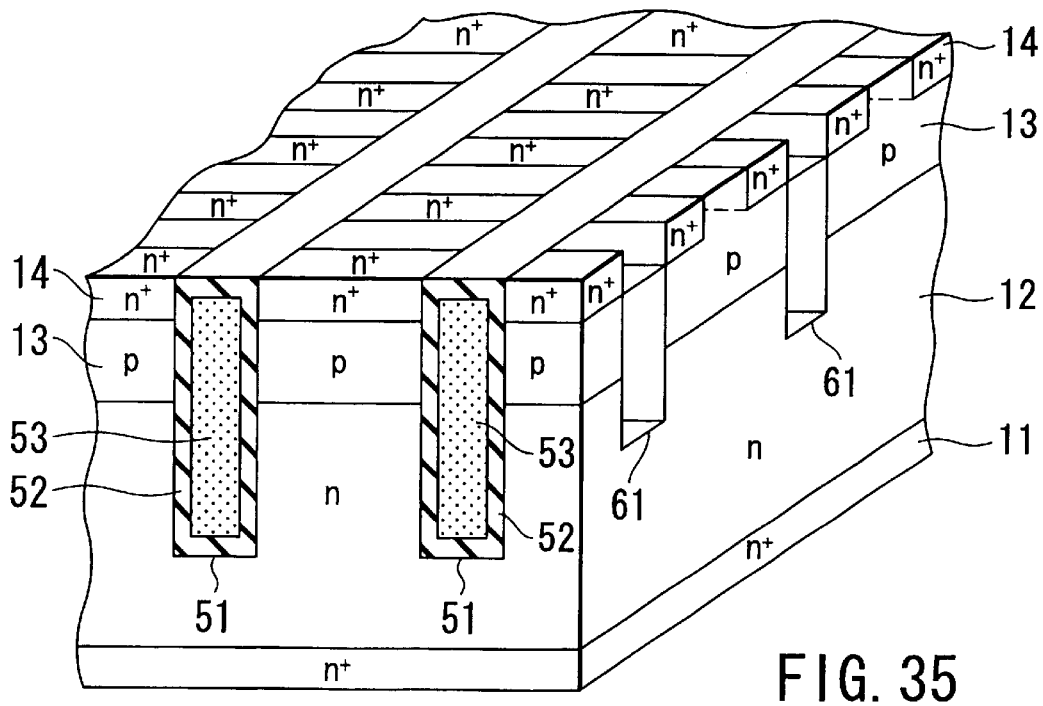

As shown in FIG. 35, the plurality of second trenches 61 are formed between the first trenches 51 in a direction to cross the first trenches 51 (a direction perpendicular to the first trenches 51), i.e., the horizontal direction by, for example, RIE. Obviously, the source layers 14 may not be formed in a striped pattern as shown in FIG. 31, but the source layer 14 may be formed on the entire surface of the well layer 13 and formed into the pattern shown in FIG. 35 by forming the second trenches 61. This second trench 61 is formed to reach the inside of the drift layer 12 from the surface of the source layer 14 through the well layer 13, but is shallower than the first trench 51. This second trench 61 need not always be formed in contact with the first trench 51.

Figure 36:
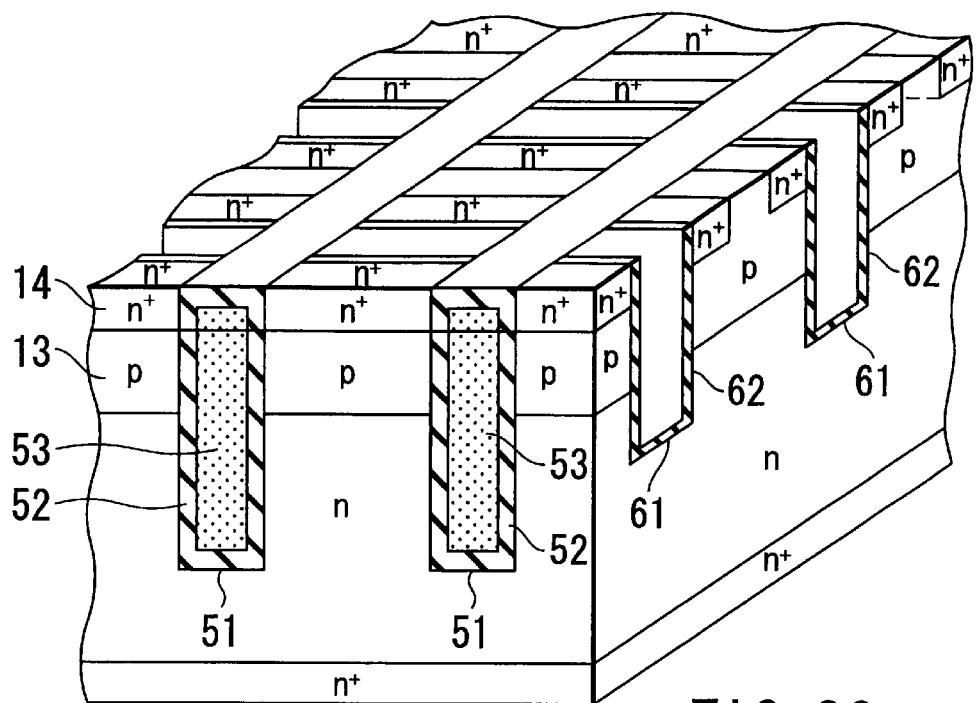

As shown in FIG. 36, the second insulating film 62 having a thickness of, for example, 400 to 450 Å is formed on the side and bottom surfaces of the second trench 61 by, for example, thermal oxidation.

Figure 37:
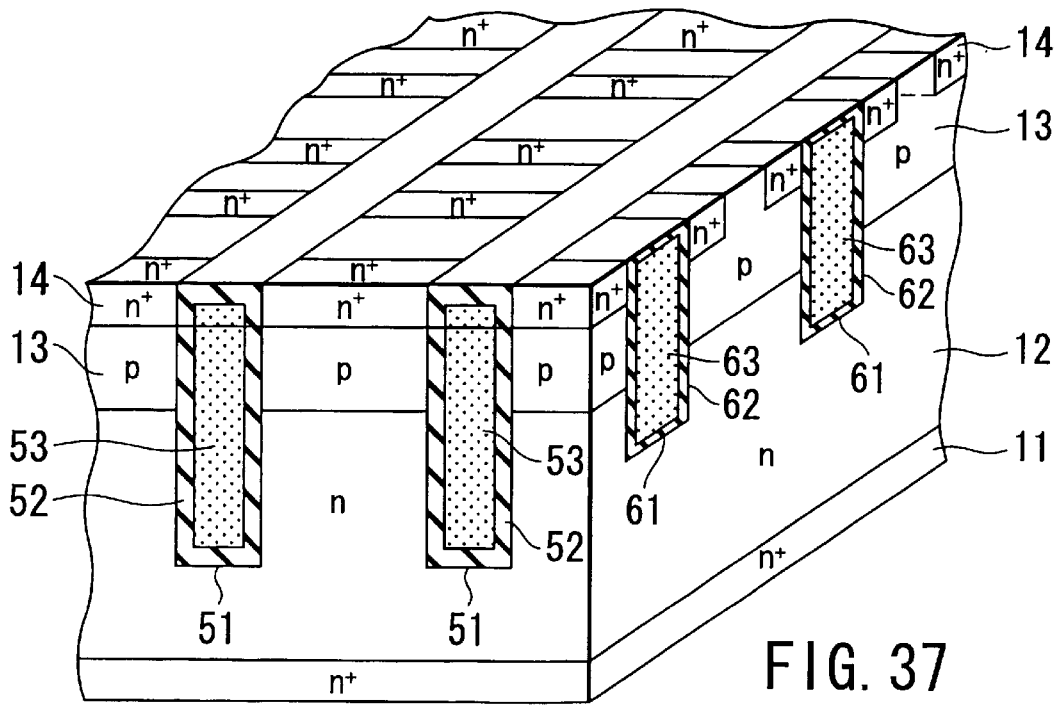

As shown in FIG. 37, a polysilicon film is formed in the second trench 61 and on the well layer 13 to fill the second trench 61. This polysilicon film is then etched back such that the etched-back surface becomes flush with the surface of the well layer 13. The second insulating film 62 is formed on the surface of the polysilicon film on the upper portion of the second trench 61 by, for example, thermal oxidation. Note that the second insulating film 62 on the upper portion of the second trench 61 may be formed by deposition. As a result, the gate electrode 63 made of polysilicon is formed in the second trench 61.

In the fifth embodiment, the same effects as those of the first embodiment can be obtained. In addition, since the buried electrode 53 and gate electrode 63 are respectively formed in the different trenches 51 and 61, the manufacturing process is facilitated as compared with the first embodiment in which these electrodes are formed in the same trench 15.

In the above example of the manufacturing steps, the gate structure with shallow trenches (or a planar structure to be described later) is formed after the deep trenches are formed. However, deep trenches may be formed and filled after a gate structure is formed, for example, immediately before the electrode formation step.

In the fifth embodiment, the second trenches 61 are formed to cross the first trenches 51. However, the second trenches 61 may be formed along the first trenches 51, and the source layers 14 may be formed in contact with the second trenches 61.

In the fifth embodiment, the source layers 14 between the gate electrodes 63 are formed such that one end portion of each source layer 14 is connected to the corresponding gate electrode 63, and the other end portion of each source layer 14 does not come into contact with the other end portion of an adjacent source layer 14. However, the other end portion of each source layer 14 may come into contact with the other end portion of an adjacent source layer 14. In this case, in the structure shown in FIG. 31, the source layer 14 may be formed on the entire surface of the well layer 13 and formed into the pattern shown in FIG. 35 by self alignment using the second trenches 61.

In the fifth embodiment, the first trenches 51 and second trenches 61 are formed in striped patterns and cross at right angles. According to a characteristic feature of the present invention, the first trenches 51 for ensuring a breakdown voltage are formed independently of the second trenches 61 for the formation of gates. Obviously, these trenches may be circular, rectangular, hexagonal, or the like instead of being striped, as described above. In addition, these trenches may take any pattern, e.g., extending parallel or crossing at 60°, instead of crossing at right angles.

Furthermore, the first trenches 51 may be formed to reach the semiconductor substrate 11.

[Sixth Embodiment]

Figure 38:
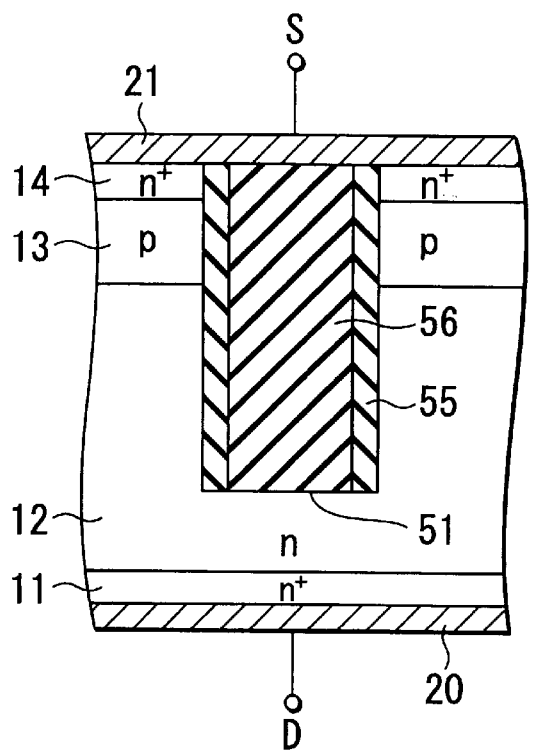
FIG. 38 is a sectional view showing the main part of a semiconductor element according to the sixth embodiment of the present invention.

FIG. 38 is a sectional view showing the main part of a power MOSFET (semiconductor element) according to the sixth embodiment of the present invention.

This embodiment is the same as the fifth embodiment except in the structure of a buried gate electrode. A detailed description of structures common to the fifth embodiment will be omitted.

As shown in FIG. 38, in this embodiment, an insulating film 55 made of $SiO_2$ or the like is formed on the inner surface of a second trench 51 except for the bottom surface. The trench 51 is the filled with a semi-insulating film 56 such as an SIPOS (Semi-Insulating Polycrystalline Silicon) film, thereby forming a buried electrode having the same function as that of the buried electrode in the sixth embodiment.

This sixth embodiment described above can obtain the same effects as those of the fifth embodiment.

[Seven Embodiment]

Figure 39:
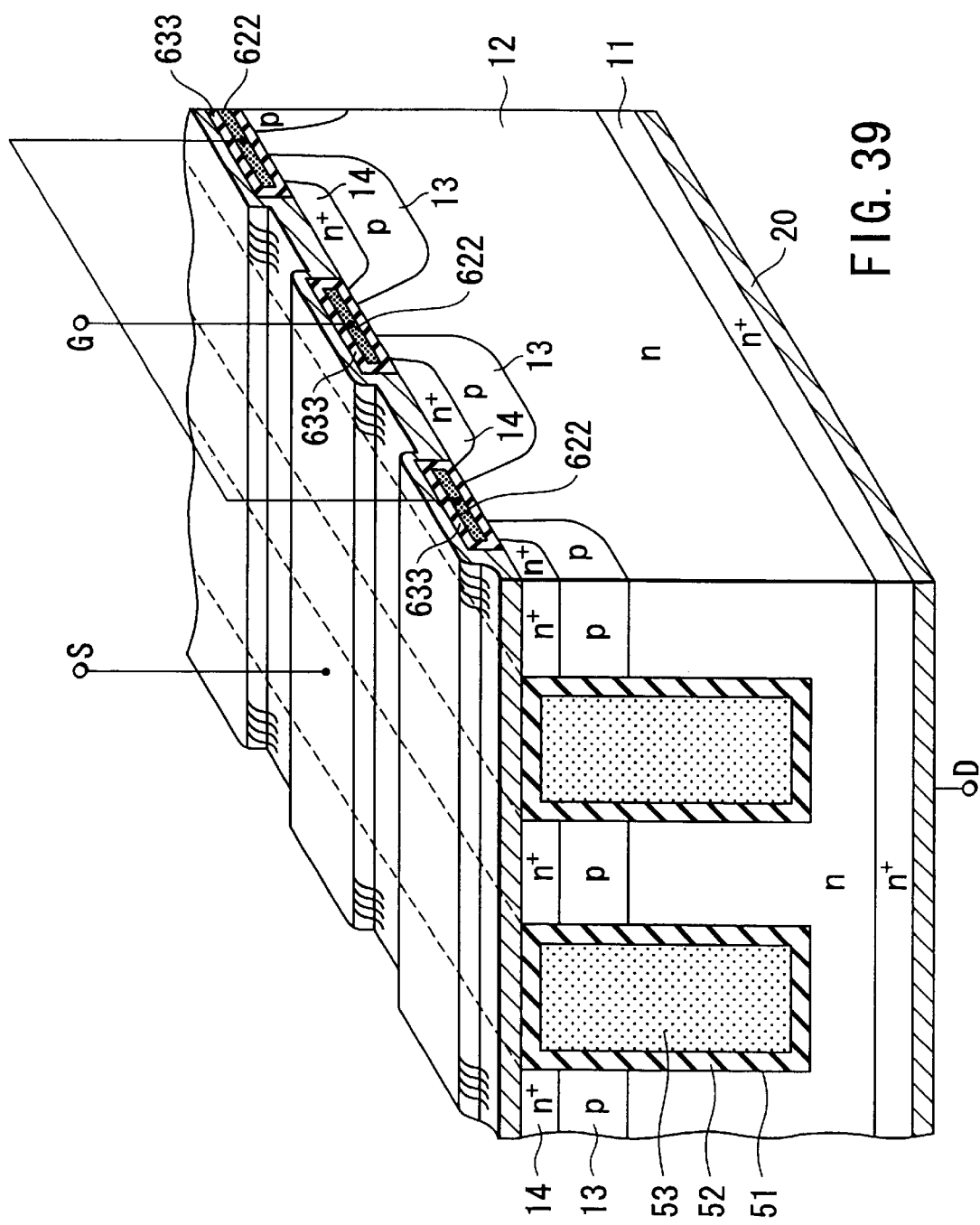
FIG. 39 is a sectional view showing the main part of a semiconductor element according to the seventh embodiment of the present invention.

FIG. 39 is a sectional view showing the main part of a power MOSFET (semiconductor element) according to the seventh embodiment of the present invention.

This embodiment is the same as the fifth embodiment except for the structure of each gate electrode. A detailed description of structures common to the fifth embodiment will be omitted.

As shown in FIG. 39, this embodiment uses gate electrodes having a planar structure. Gate insulating films 622 are formed in place of the second insulating films 62 in the fifth embodiment, and gate electrodes 633 are formed in place of the gate electrodes 63.

More specifically, striped p-type well layers 13 are selectively formed in the surface of a drift layer 12 in the horizontal direction. Striped $n^+$-type source layers 14 are selectively formed in the surfaces of the well layers 13. Striped first trenches 51 are then formed in the vertical direction to cross the striped well layers 13 and source layers 14 at right angles. A buried electrode 53 is formed in each first trench 51 through a first insulating film 52. The gate electrode 633 is formed on the surfaces of the well layer 13 and drift layer 12 between one of adjacent source layers 14 and the other source layer 14 through the gate insulating film (second insulating film) 622.

In the seventh embodiment as well, the same effects as those of the fifth embodiment can be obtained.

In the seventh embodiment, the well layers 13 and source layers 14 are formed to cross the trenches 51. However, they may be formed along the trenches 51.

In the above embodiment, the trenches 51 and gate electrodes 633 are formed in the striped pattern and cross each other. According to a characteristic feature of the present invention, the first trenches 51 for ensuring a breakdown voltage are formed independently of the gate electrodes 633. Obviously, these trenches may be circular, rectangular, hexagonal, or the like instead of being striped, as described above. In addition, these trenches may take any pattern, e.g., extending parallel or crossing at 60°, instead of crossing at right angles.

Furthermore, the trenches 51 may be formed to reach the semiconductor substrate 11.

[Eighth Embodiment]

Figure 40:
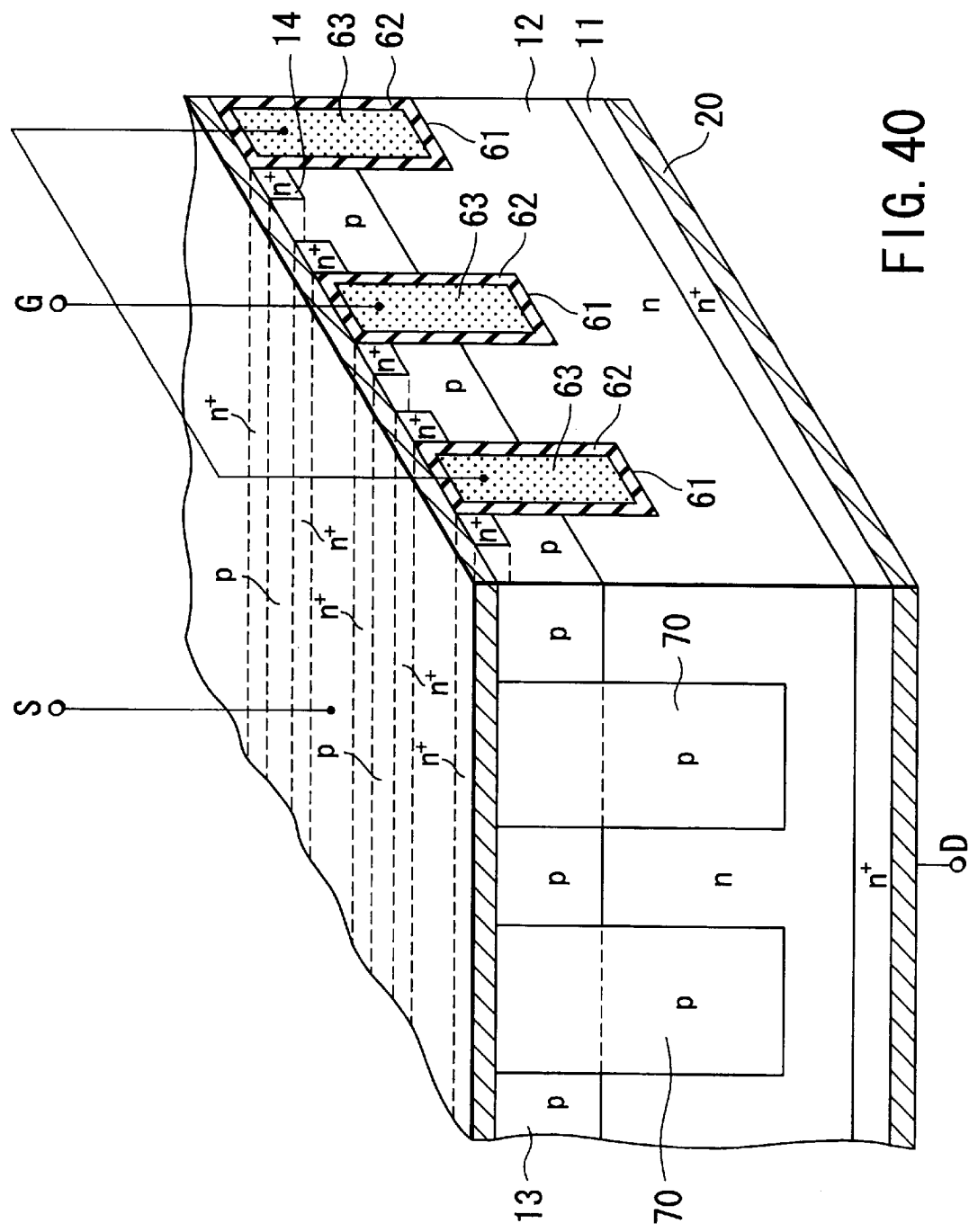
FIG. 40 is a sectional view showing the main part of a semiconductor element according to the eighth embodiment of the present invention.

FIG. 40 is a perspective view showing the main part of a power MOSFET according to the eighth embodiment of the present invention.

This embodiment is the same as the fifth embodiment except for the structure of each buried gate electrode. A description of structures common to the fifth embodiment will be omitted, and only different structures will be described.

As shown in FIG. 40, in this embodiment, an n-type drift layer 12 is formed on one surface of an $n^+$-type semiconductor substrate 11, and a p-type well layer 13 is formed in the surface of the drift layer 12.

A plurality of p-type buried diffusion layers 70 serving as striped buried electrodes are formed through the well layer 13 in the vertical direction (up-and-down direction on the drawing) to reach a portion in the drift layer 12 which is located near the semiconductor substrate 11 from the surfaces of source layers 14.

The $n^+$-type source layers 14 are selectively formed in the well layer 13 at predetermined intervals in a direction to cross the buried diffusion layers 70 (e.g., a direction to cross them at right angles), i.e., the horizontal direction.

A plurality of striped second trenches 61 are formed to reach the inside of the drift layer 12 from the surface of the source layers 14 through the well layer 13 so as to cross the buried diffusion layers 70, for example, at right angles. The second trenches 61 are preferably formed to be shallower than the buried diffusion layers 70. A gate electrode 63 serving as a control electrode is formed in each second trench 61 through a second insulating film 62 for channel formation.

Note that even if the gate electrodes 63 and source layers 14 exist on the buried diffusion layers 70, these portions are irrelevant to the operation of the MOSFET. Hence, no problem arises. In addition, it is preferable that the gate electrodes 63 and source layers 14 be selectively formed only in the regions between the buried diffusion layers 70. In this case, however, the manufacturing process is slightly complicated.

A drain electrode 20 is formed on the other surface of the semiconductor substrate 11, and source electrodes 21 connected to the source layers 14 and well layer 13 are formed on the well layer 13.

The buried diffusion layers 70 are connected to the source electrodes 21. The gate electrodes 63 are insulated from the buried diffusion layers 70 and source electrodes 21 and connected to overlying extraction gate electrodes (not shown).

In the eighth embodiment as well, the same effects as those of the fifth embodiment can be obtained.

[Ninth Embodiment]

Figure 41:
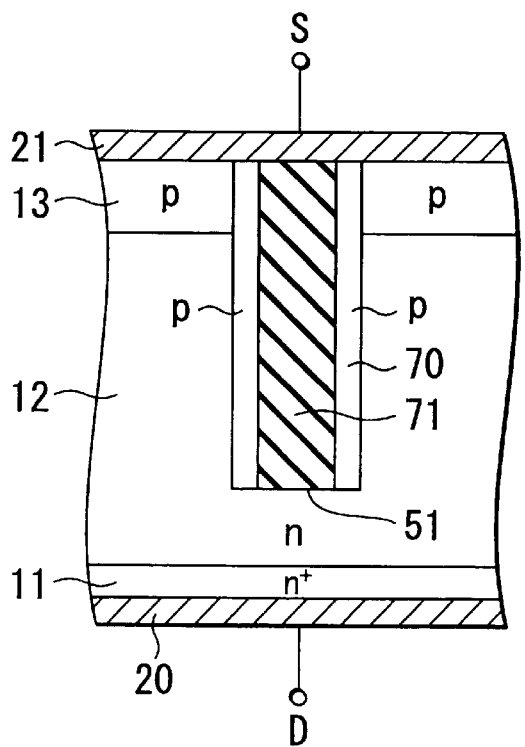
FIG. 41 is a sectional view showing the main part of a semiconductor element according to the ninth embodiment of the present invention.

FIG. 41 is a sectional view showing the main part of a power MOSFET (semiconductor element) according to the ninth embodiment of the present invention.

This embodiment is the same as the eighth embodiment except for the structure of each buried diffusion layer. A description of structures common to the eighth embodiment will be omitted, and only different structures will be described.

As shown in FIG. 41, in this embodiment, as in the fifth embodiment, a first trench 51 is formed, and a p-type impurity is implanted into the inner surface of the first trench 51 by, for example, oblique implantation. Thereafter, re-diffusion is performed to form a p-type buried diffusion layer 70 serving as a buried electrode. In addition, an insulating film 72 such as an $SiO_2$ film is buried in this first trench 51.

In the ninth embodiment as well, the same effects as those of the fifth embodiment can be obtained.

[10th Embodiment]

Figure 42:
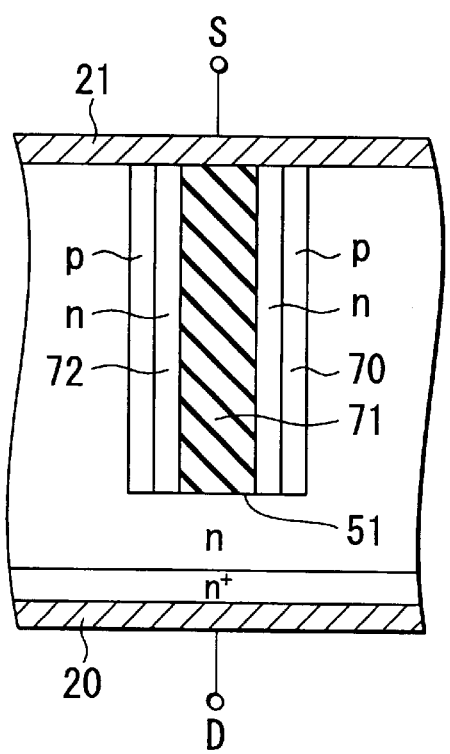
FIG. 42 is a sectional view showing the main part of a semiconductor element according to the 10th embodiment of the present invention.

FIG. 42 is a sectional view showing the main part of a power MOSFET (semiconductor element) according to the 10th embodiment of the present invention.

This embodiment is the same as the eighth embodiment except for the structure of each buried diffusion layer. A description of structures common to the eighth embodiment will be omitted, and only different structures will be described.

As shown in FIG. 42, in this embodiment, as in the fifth embodiment, a first trench 51 is formed, and p- and n-type impurities are implanted into the inner surface of the first trench 51 by, for example, oblique implantation. Thereafter, re-diffusion is performed to form an n-type diffusion layer 72 on the trench 51 side and also form a p-type buried diffusion layer 70 serving as a buried electrode between the n-type diffusion layer 72 and a drift layer 12. This first trench 51 is further filled with an insulating film 71 such as an $SiO_2$ film.

In the 10th embodiment as well, the same effects as those of the fifth embodiment can be obtained.

A structural feature of each of the fifth to 10th embodiments of the present invention described above is that channel regions are formed independently of deep trench regions for ensuring a breakdown voltage. That is, a characteristic feature of these embodiments is that channel structures (trench structures and planar structures in the embodiments) are formed in other regions independently of the material used to fill the deep trench regions and trench structure.

[11th Embodiment]

Figure 43:
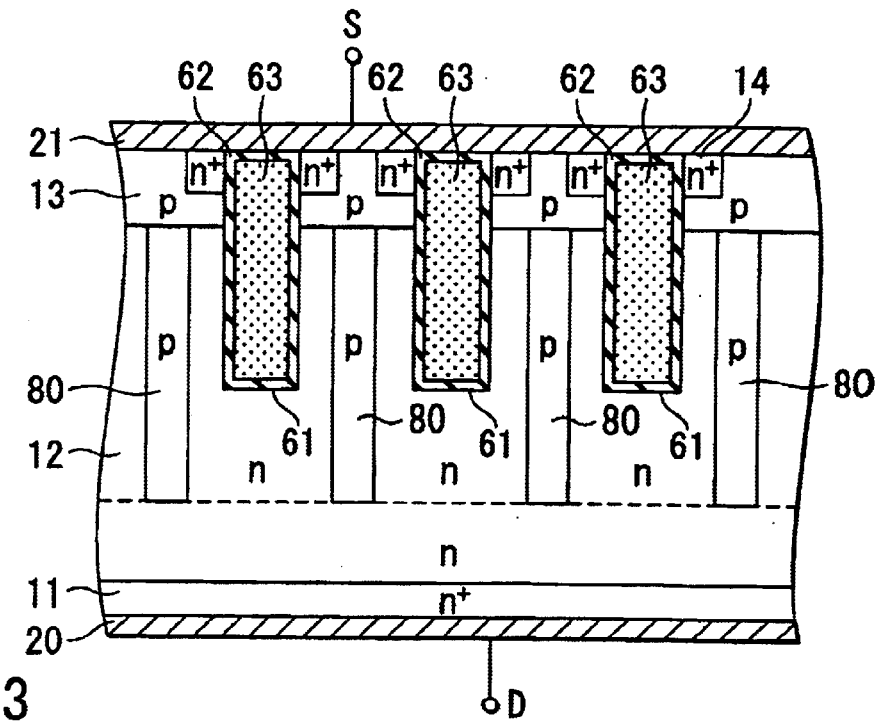
FIG. 43 is a sectional view showing the main part of a semiconductor element according to the 11th embodiment of the present invention.
Figure 44:
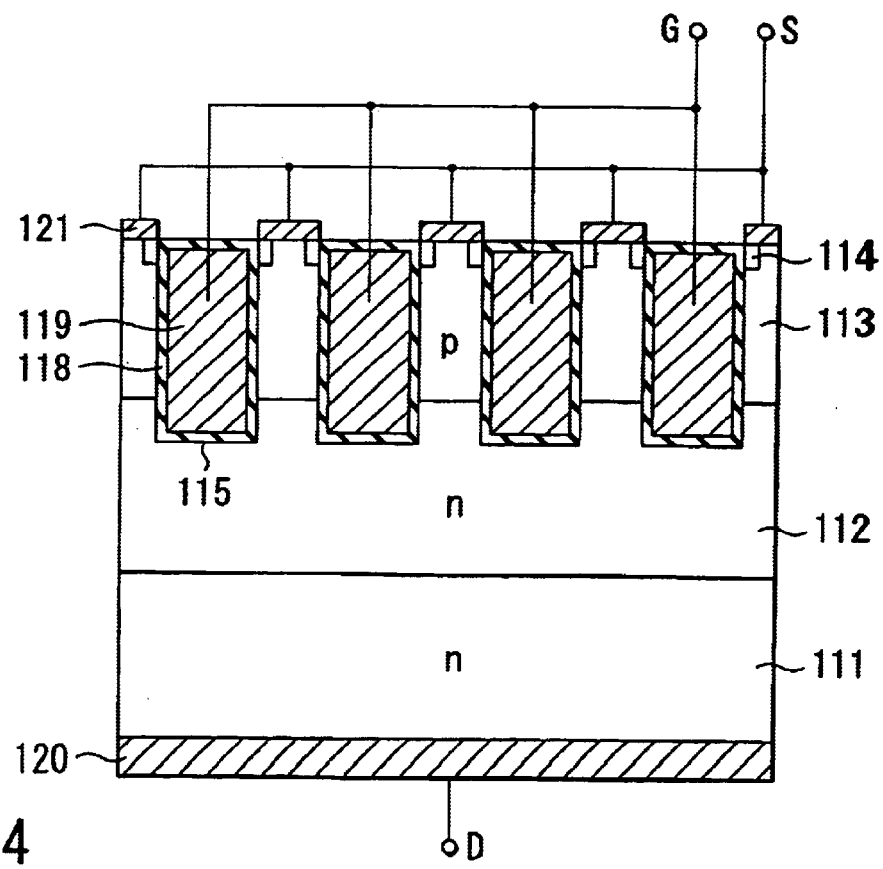
FIG. 44 is a sectional view showing a conventional semiconductor element.

FIG. 43 is a sectional view showing the main part of a power MOSFET (semiconductor element) according to the 11th embodiment of the present invention.

As shown in FIG. 43, an n-type drift layer 12 is formed on one surface of an $n^+$-type semiconductor substrate 11. A plurality of p-type buried diffusion layers 80 serving as striped buried electrodes are formed at predetermined intervals in the vertical direction to reach a portion near the semiconductor substrate 11 from the surface of the drift layer 12. A p-type well layer 13 is formed in the surface of the drift layer 12 including these buried diffusion layers 80.

Striped $n^+$-type source layers 14 are selectively formed in portions of the well layer 13 which are located between the buried diffusion layers 80 along the buried diffusion layers 80.

Striped second trenches 61 are formed through the well layer 13 along the buried diffusion layers 80 to reach the inside of the drift layer 12 from the surfaces of the source layers 14. The second trenches 61 are preferably formed to be shallower than the buried diffusion layers 80. A gate electrode 63 serving as a control electrode is formed in each second trench 61 through a second insulating film 62 for channel formation.

A drain electrode 20 is formed on the other surface of the semiconductor substrate 11. Source electrodes 21 connected to the well layer 13 and source layers 14 are formed on the well layer 13.

The buried diffusion layers 80 are connected to the source electrodes 21 through the well layer 13. The gate electrodes 63 are insulated from the buried diffusion layers 80 and source electrodes 21 and connected to overlying extraction gate electrodes (not shown).

In the 11th embodiment as well, the same effects as those of the fifth embodiment can be obtained. In addition, the gate electrodes 63, source layers 14, and buried diffusion layers 80 are formed in the same direction. This structure facilitates the manufacturing process as compared with each embodiment in which these components cross each other.

As described above, according to the first to 11th embodiments, the ON resistance can be decreased, and the breakdown voltage can be increased. In addition, a decrease in ON voltage and a reduction in element size can be attained.

According to the structure of the present invention, no buried diffusion layer as in the prior art needs to be formed to attain a decrease in ON resistance. Obviously, this makes it possible to prevent a decrease in switching speed and a deterioration in the characteristics of a reverse-conducting diode. In addition, the present invention can achieve a reduction in cost as compared with a structure having buried diffusion layers.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor element comprising:

a semiconductor substrate of a first conductivity type having a first major surface and a second major surface opposing the first major surface;

a drift layer of the first conductivity type formed on the first major surface of said semiconductor substrate;

a well layer of a second conductivity type selectively formed in a surface of said drift layer;

a source layer of the first conductivity type selectively formed in a surface of said well layer;

a trench formed to reach at least an inside of said drift layer from a surface of said source layer through said well layer;

a buried electrode having a first portion and a second portion being continuous to the first portion, the first portion being formed through a first insulating film in a region extending from the trench of said drift layer to a bottom surface of said trench, the second portion being led out from the first portion to an outside of a terminal portion;

a control electrode formed in a region extending from said source layer to said drift layer through said well layer in said trench to be insulated from said buried electrode through a second insulating film;

a first main electrode formed on the second major surface of said semiconductor substrate; and a second main electrode connected to said source layer and said well layer.

2. An element according to claim 1, wherein said first insulating film has a thickness larger than a value obtained by multiplying a static breakdown voltage of said element by 20 Å.

3. An element according to claim 1, wherein the first insulating film is thicker than the second insulating film.

4. An element according to claim 1, wherein an impurity concentration of said drift layer gradually increases toward said semiconductor substrate.

5. An element according to claim 1, wherein an impurity concentration of said drift layer is high near a side wall of said trench.

6. An element according to claim 1, wherein said trench takes the form of a stripe.

7. An element according to claim 1, wherein said buried electrode is electrically connected to said first or second main electrode.

8. An element according to claim 1, wherein said buried electrode is formed by burying a semi-insulating film in said trench through the first insulating film.

9. An element according to claim 1, wherein said buried electrode set in a floating state.

10. An element according to claim 1, wherein the trench has one of a circular horizontal cross section, a square horizontal cross section and a regular hexagonal horizontal cross section.

11. A semiconductor element comprising:

a semiconductor substrate of a first conductivity type having a first major surface and a second major surface opposing the first major surface;

a drift layer of the first conductivity type formed on the first major surface of said semiconductor substrate;

a well layer of a second conductivity type selectively formed in a surface of said drift layer;

a source layer of the first conductivity type selectively formed in a surface of said well layer;

a trench formed to reach at least an inside of said drift layer from a surface of said source layer through said well layer, the trench having one of a circular horizontal cross section, a square horizontal cross section and a regular hexagonal horizontal cross section;

a buried electrode formed through a first insulating film in a region extending from the trench of said drift layer to a bottom surface of said trench;

a control electrode formed in a region extending from said source layer to said drift layer through said well layer in said trench to be insulated from said buried electrode through a second insulating film;

a first main electrode formed on the second major surface of said semiconductor substrate; and a second main electrode connected to said source layer and said well layer, wherein said first insulating film has a thickness which increases gradually toward said semiconductor substrate.

* * * * *